(12) United States Patent
Gilmour et al.

(10) Patent No.: US 7,250,710 B2
(45) Date of Patent: Jul. 31, 2007

(54) LIGHT-EMITTING DEVICE HAVING GRATING FOR ALIGNING LIGHT-EMISSIVE LAYER

(75) Inventors: Sandra Gilmour, Stow-on-the-Wold (GB); Geraldine Laura Ballantyne Verschoor, Oxford (GB); Grant Bourhill, Stow-on-the-Wold (GB)

(73) Assignee: Sharp Kabushiki Kaisha, Osaka (JP)

( * ) Notice: Subject to any disclaimer, the term of this patent is extended or adjusted under 35 U.S.C. 154(b) by 344 days.

(21) Appl. No.: 10/871,753

(22) Filed: Jun. 18, 2004

(65) Prior Publication Data

US 2004/0263060 A1 Dec. 30, 2004

(30) Foreign Application Priority Data

Jun. 20, 2003 (GB) ................... 0314408.6

(51) Int. Cl.
*H01J 5/16* (2006.01)
*H01J 1/62* (2006.01)

(52) U.S. Cl. ..................... 313/112; 313/506
(58) Field of Classification Search ........ 313/498–512, 313/110–112; 315/169.3; 345/36, 45, 76
See application file for complete search history.

(56) References Cited

U.S. PATENT DOCUMENTS 4,241,277 A * 12/1980 Hintze et al. ............... 313/500
6,628,068 B1 * 9/2003 Rorison et al. ............. 313/504
6,831,407 B2 * 12/2004 Cok ........................... 313/504
2002/0161153 A1 * 10/2002 Bao et al. ................... 526/293
2006/0034492 A1 * 2/2006 Siegel et al. ................ 382/115

FOREIGN PATENT DOCUMENTS

JP 01-186588 7/1989

OTHER PUBLICATIONS

Korean Search Report for corresponding application No. 519980961371dated Feb. 21, 2006.

* cited by examiner

*Primary Examiner*—Joseph Williams
*Assistant Examiner*—Bumsuk Won
(74) *Attorney, Agent, or Firm*—Renner, Otto, Boisselle & Sklar, LLP

(57) ABSTRACT

A light-emitting device includes a substrate, a light-emissive layer disposed over the substrate, and a grating for aligning the light-emissive layer. The grating aligns molecules of the emissive layer, so that the device emits polarised. The grating also reduces wave guiding effects in the device, so increasing the useful light output of the device. The light-emitting device may be an organic light-emitting device (OLED). The grating may align substantially the entire area of the light-emissive layer in a first direction. In this case, substantially the entire emissive area of the device will emit layer of a single polarisation. Alternatively, the grating may align a first region of the light-emissive layer in a first direction and may align a second region of the light-emissive layer in a second direction different from the first direction.

32 Claims, 12 Drawing Sheets

FIG 9
(a) 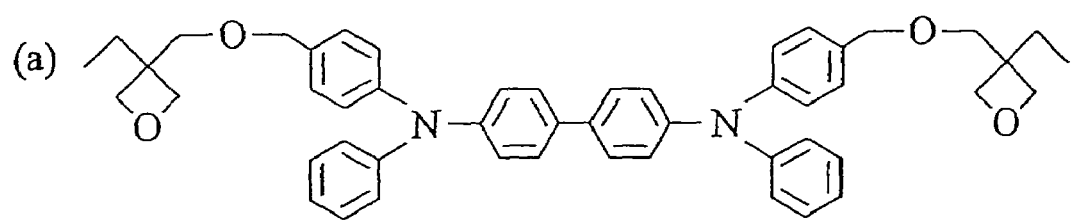
(b) 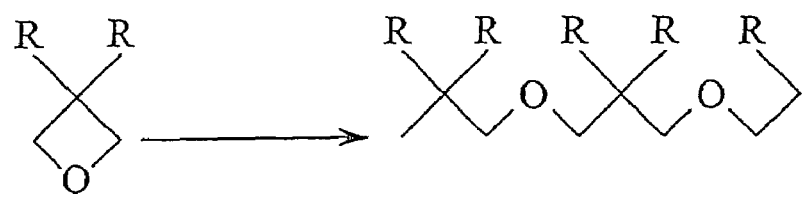
FIG 10
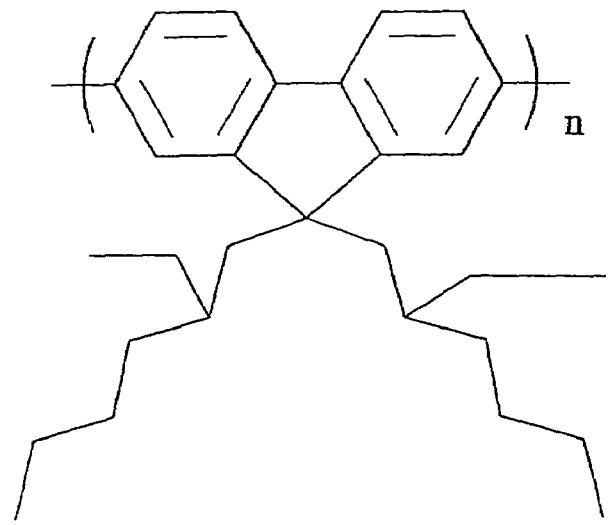

FIG 16(a)
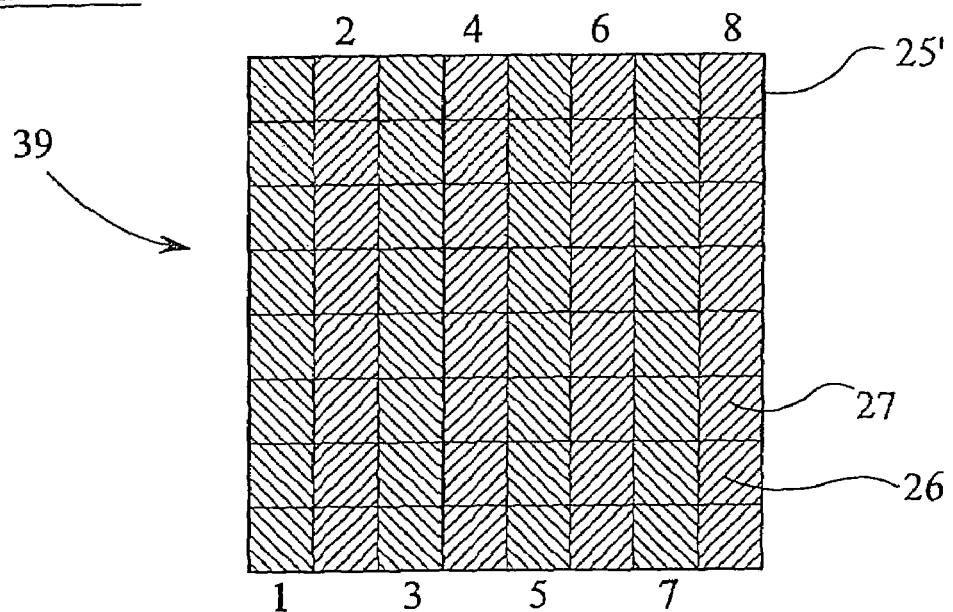
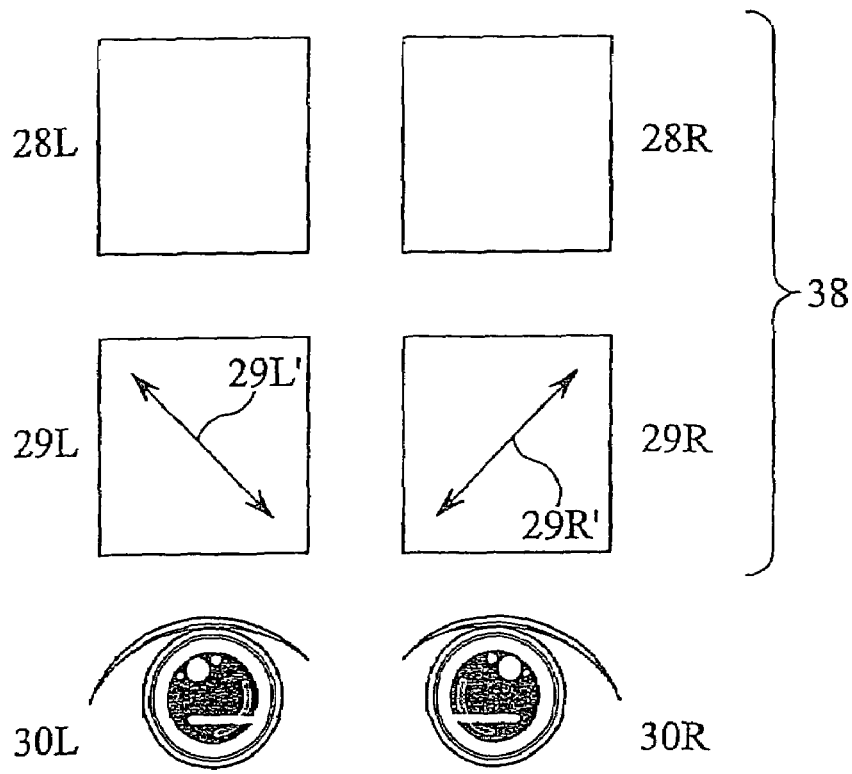

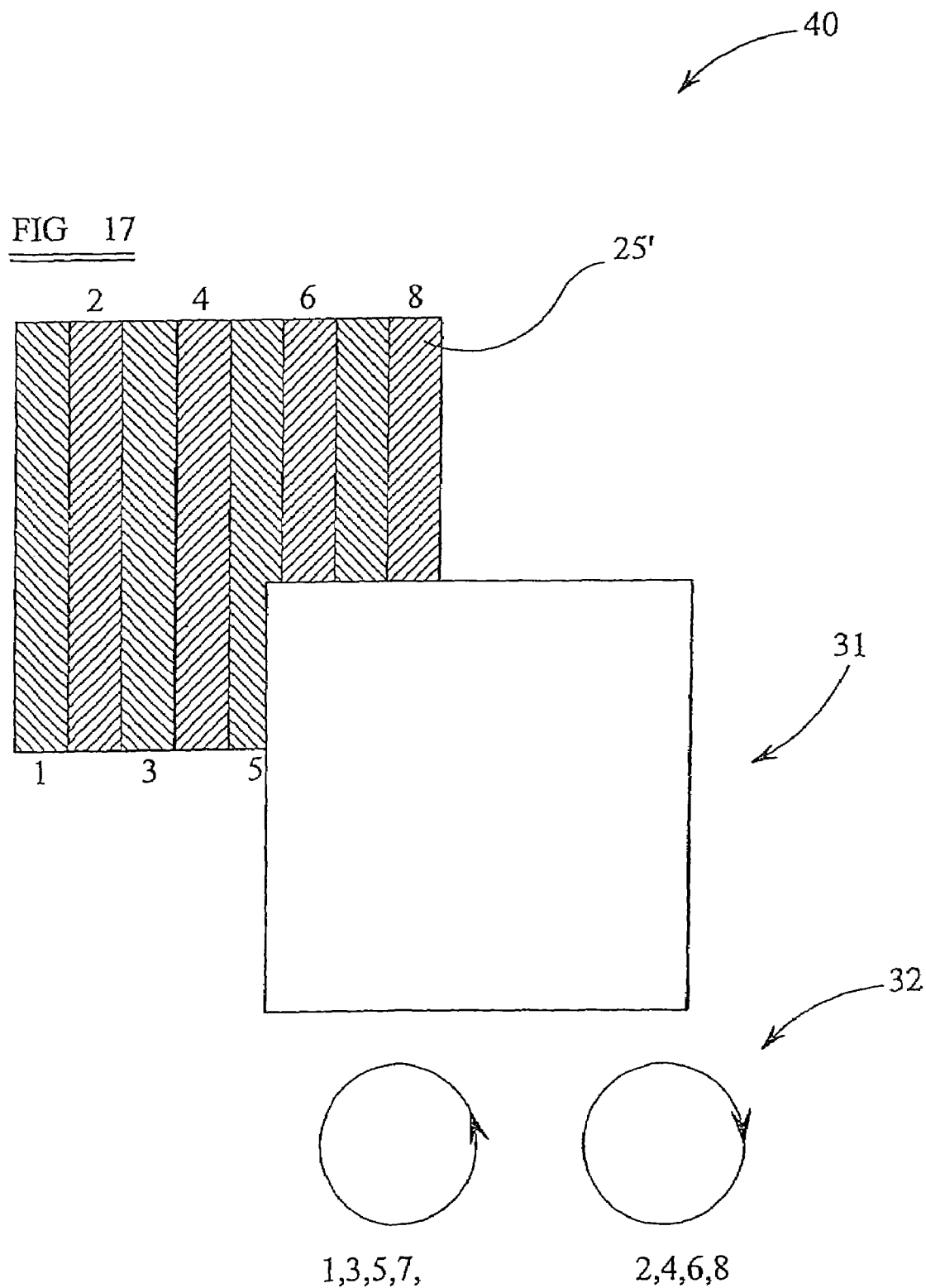

LIGHT-EMITTING DEVICE HAVING GRATING FOR ALIGNING LIGHT-EMISSIVE LAYER

This Nonprovisional application claims priority under 35 U.S.C. §119(a) on patent application No. 0314408.6 filed in Great Britain on Jun. 20, 2003, the entire contents of which are hereby incorporated by reference.

BACKGROUND OF THE INVENTION

1. Field of the Invention

The present invention relates to a light-emitting device such as, for example, an organic light-emitting device. It particularly relates to an organic light-emitting device that is able to emit light having a degree of polarisation. The invention may be applied to an organic electroluminescent device (OLED).

2. Description of the Related Art

Many OLEDs are known, but currently available OLEDs generally emit light that is substantially unpolarised. It would be desirable to manufacture an OLED that is able to emit polarised light, for example plane-polarised light. (The term "polarised light" as used herein includes light that is partially polarised, and is not limited to light that is completely polarised.)

For example, one use of an OLED is as a light source for a liquid crystal (LC) display device. A transmissive liquid crystal display device consists essentially of a layer of addressable liquid crystal material disposed between a front polariser and a rear polariser. The display device is illuminated by a light source which is disposed behind the rear polariser and so is known as a "backlight". An OLED that emits polarised light would be particularly useful for a backlight for a conventional liquid crystal display device, because it could make the rear polariser unnecessary and so would allow the rear polariser, and its associated cost, weight and power-inefficient absorptive loss, to be eliminated.

An OLED contains a light-emissive layer, which emits light by the phenomenon of electroluminescence. Polarised electroluminescence (EL) has been achieved by aligning the molecules of the emissive layer within the device and several approaches have been used to achieve this alignment as described by M. Grell et al. in "Adv. Mat." 11(11) pp895-905 (1999). The degree of polarisation of the emitted light can be expressed as the "dichroic ratio" (D), which is defined as the ratio of the intensity of the emitted light polarised parallel to the alignment direction of the emitter molecules to the intensity of the emitted light polarised perpendicular to the alignment direction of the emitter molecules. Depending upon the intended use of the OLED, the dichroic ratio is normally required to be in the range $D \approx 12\text{-}200$.

One conventional approach obtaining polarised electroluminescence is to align the molecules of the emitter layer by stretching the emitter layer. Polarised electroluminescence, with $D \approx 2.4$, has been reported for a stretched polythiophene film by P. Dyreklev et al., in "Adv. Mat." 7(1) pp43-4.5 (1995). However, with this method it is not possible to set an exact thickness for the stretched light-emissive layer. Furthermore, inhomogeneities and cracks can occur in the emissive layer as a result of the mechanical stretching process.

A different prior approach is that of rubbing a conjugated polymer film to define a preferred alignment direction for molecules of the polymer film. M. Hamaguchi et al. have reported, in "Appl. Phys. Lett." 67, pp3381 (1995), photoluminescence (PL) with a dichroic ratio $D \approx 5$ for alkoxy substituted poly(phenylenevinylene) (NO-PPV). However, the rubbing process leads to scratches in the polymer film, and these shorten the lifetime of the device.

Another method for aligning molecules of an emitter layer is that of Langmuir Blodgett (LB) deposition. G. Wegner describes, in "Thin Solid Films" 216, 105 (1992), stiff-chain polymers having solubilising alkyl side chains, such as phthalocyanines or poly(p-phenylenes), as a new class of substances which form LB films. In such polymer films, the polymer molecules are aligned parallel to the substrate and display anisotropic behaviour in respect of various physical properties. The surfaces of such LB films are very homogeneous and the thickness of the layers can be set very accurately. EP 0 081 581 describes EL with $D \approx 4$ for a device fabricated by direct build up conjugate stiff chain polymers using the LB technique. The LB technique is however unsuitable for device manufacture on a commercial scale.

Many organic EL materials possess liquid crystalline (LC) phases. LC self-organisation is a very effective method of achieving high degrees of alignment, because of the high order parameters of liquid crystal materials. The EL material can be either a low molecular weight (LMW) LC material where hole-conducting or electron-conducting groups, for example, are attached to a LC backbone or an LC polymer such as one of the substituted poly-phenylenevinylenes (PPVs) or one of the polyfluorenes (which are well-characterised EL polymers).

A specific problem for polarised electroluminescent devices based on liquid crystal-material is that such devices require an alignment layer to align the liquid crystal material, and this applies to both LMW and polymeric LC materials. Conventional alignment layers, such as polyimides, are electrical insulators and would therefore strongly hinder the device performance. G. Luissem et al. describe, in "Liquid Crystals" 21(6) pp903-907 (1996), the alignment of LC polymers consisting of isolated phenylenevinylene units separated by flexible spacers on a rubbed polyimide alignment layer. The described current-voltage characteristics show that the device turn-on voltage is around 15V, which is too high for the device to be of practical use. Furthermore, the observed dichroic ratio $D \approx 7$ lies below that typically required.

U.S. Pat. No. 5,748,271 describes a layer that combines alignment of an LC material with another device function. For example, rubbed layers of the hole injection material poly(3,4-ethylenedioxythiophene) (PEDOT) or polyanilene (PANI) have been shown to align reactive mesogen/perylene blends with a dichroic ratio $D \approx 2$. However, LMW LCs can be aligned more easily than polymers, so it is not at all certain that rubbed PEDOT or PANI will align a conjugated LC polymer.

Moderate alignment of LC polymers (copolymers of polyfluorene) was obtained by M. Grell et al., in "Liquid Crystals" 26(9) pp1403-1407 (1999) using a rubbed film of the precursor of PPV in conjunction with an active material that emits at a wavelength far enough towards the red end of the spectrum ($\lambda > 550$ nm) for precursor PPV to appear transparent to the emitted light. Anisotropy in the absorption was observed with a maximum dichroic ratio $D \approx 10$. Photoluminescence or electroluminescence were not recorded. Generally, alignment using rubbed active layers is not particularly good and the anisotropy possible is much less than for a standard rubbed polyimide alignment layer.

One particular application for light emitting elements is in a stereoscopic display device. A stereoscopic display, where the viewer has to wear, for example, polarising or colour-filter glasses to obtain a 3D image effect, are well-known, and are described in, for example, "Stereo computer graphics and other true 3D technologies" edited by D. F. McAllister, pp90-115, Princeton University Press (1993). Essentially, a stereoscopic display device displays an image for the left eye of an observer and another image for the right eye of the observer. The two images may be displayed time-sequentially, or they may be displayed simultaneously on different parts of the display. The two images are in different wavelength ranges or have different polarisations, and the observer must wear polarising or colour-filter glasses that allow the observer's left eye to see only the left eye image while allowing the observer's right eye to see only the right eye image. The use of images having different polarisations is today more common.

A stereoscopic display device may be a passive device, in which the polarisers or colour filters provided on the display device and the polarisers or colour filters in the observer's glasses are passive devices—i.e., they have fixed transmission properties such as fixed transmission axes (in the case of polarisers) or transmit over fixed wavelength ranges (in the case of colour filters).

Alternatively, a stereoscopic display device may be an active device, in which the transmission properties of the polarisers or colour filters provided in the observer's glasses are controllable and so can be changed.

Stereoscopic displays often use a conventional spatial light modulator (SLM), such as a liquid crystal display device, with additional internal or external optics attached to the display to generate the initial conditions for stereoscopic viewing. These additional optics can add to the bulk, complexity and cost of the display device, and often cause display contrast degradation (for example where neighbouring columns in the SLM are operating in normally black and normally white mode as disclosed in U.S. Pat. No. 5,264,964).

Where the image forming element is a conventional cathode ray tube (CRT) with either active or passive polarising optics attached to the face-plate, the resulting 3-D image often suffers from high cross-talk. Cross-talk is the ratio of one eye image perceived by the second eye, and results in this case from CRT phosphor persistence as described by D. F. McAllister (above). This problem occurs, for example, when the left eye image and right eye image are displayed in a time-sequential manner. Further, there is often a perceived brightness variation down the CRT screen caused by low liquid crystal switching speeds in the polarising optics and CRT phosphor persistence. It is generally desirable for a stereoscopic display device to be able to function as a conventional 2-D display device. This can be done, irrespective of whether a LCD or CRT is used as the image-forming element, by displaying conventional 2-D images and having the user remove their polarising or colour-filter glasses. However, conventional stereoscopic viewing systems require the provision of the external permanent polarising optics on the display, and the polarising optics normally reduces the inherent brightness of the display. For example, in a device having a CRT display screen the CRT phosphors emit nominally unpolarised light, and polarising optics are mounted on the face-plate to polarise the light emitted by the CRT phosphors. The inherent brightness of the CRT display is reduced owing to absorption of light in the polarising optics.

One prior art approach to the problems of variations in brightness down the screen and high display cross-talk, for a passive stereoscopic display system, is to partition the liquid crystal switch attached to the image forming element. However, this approach adds cost and complexity to the LC switch drive circuitry. Furthermore, this solution cannot be adopted for active stereoscopic systems, as described D. F. McAllister (above).

As discussed above, high cross-talk and brightness variations down the screen are often perceived with CRT-based stereoscopic systems owing to image persistence resulting from the long radiative decay times of the CRT phosphors. This problem can be avoided when using emissive displays with shorter radiative decay times. One example of this type of display is organic light emitting diodes (OLEDs).

It has been suggested, in "Advanced Materials", Vol. 14(20), pp1477-1480 (2002) to use a conventional unpolarised OLED as the display screen in a passive stereoscopic 3D display system, working in co-operation with a permanent patterned polariser. This addresses the problem of image persistence, but has the disadvantage that the inherent brightness of the OLED display is significantly reduced due to the analysing affect of the patterned polariser.

At best, 50% of the inherent display brightness would be transmitted through the patterned polariser. Increasing the OLED current density can increase the intensity of the output from the OLED and compensate for the intensity loss caused by the polariser, but this severely degrades the OLED lifetime. Further, this prior art suffers from the need for correct registration between the patterned polariser and the pixels of the OLED display. Without correct registration, Moire effects would be observed (degrading the image quality in display of a 2-D image) and parallax problems would result in high cross-talk when the device is used to display a 3D image. The need for correct registration means that the patterned polariser and the OLED display must be manufactured to strict tolerances, thereby increasing the manufacturing costs.

To avoid the decrease in inherent display brightness, it would be advantageous if emissive displays with short radiative relaxation times could be used, where the light emission from the image-forming display elements was inherently polarised (with a high polarisation purity). This would avoid the brightness reduction, cost, complexity and bulk of adding external polarising optics.

Methods to achieved polarised emission from an aligned conjugated polymer (that could be used for an OLED display) have been disclosed in a conventional 2-D display in *Chem. Phys. Lett.* 341, pp219-224 (2001). This prior art used a highly birefringent emissive polymer sandwiched between a dielectric Bragg-stack mirror and a metallic mirror in a microcavity. The birefringence of the polymer affects the resonance modes of the cavity, allowing one polarisation to resonate constructively within the cavity whereas the modes of the other polarisation destructively interfere. Although not demonstrated for electrically driven light emission, photo-excitation showed that polarisation purity ratios exceeding 300:1 were obtained. However, the use of microcavities is complex and costly, they suppress the inherent brightness of the OLED (and thus affect OLED lifetime owing to the need to increase the drive current to compensate), and they are expected to show significant colour and brightness variations when viewed in directions away from normal incidence. Further, there may also be light leakage of the wrong polarisation state at a different colour during emission of the desired polarisation state. This would lead to cross-talk and colour artefacts if used in stereoscopic display device operating in the 3-D mode, and the colour artefacts would also be present when operating in the 2D mode.

GB-A-2 344 691 discloses an electroluminescent device in which the emitter molecules of the light-emissive layer are aligned along a pre-determined direction so that the emissive layer emits polarised light. The emissive molecules are aligned either by applying an external electric or magnetic field and fixing the direction of the emissive molecules while the external field is applied or by a separate alignment layer provided in the device specifically to align the molecules of the emissive layer.

EP-A-1 081 774 discloses an organic light-emitting device in which a conventional rubbed alignment layer is provided in the device specifically to align the molecules of the emissive layer thereby to obtain emission of polarised light.

SUMMARY OF THE INVENTION

The present invention provides a light-emitting device comprising a substrate, a light-emissive layer disposed over the substrate, and a grating structure for aligning the light-emissive layer whereby, in consequence of alignment of the light-emissive layer by the grating structure, the device emits, in use, light that is at least partially plane-polarised. The light-emissive layer may contain a material having a liquid crystalline phase.

A light-emitting device of the invention emits polarised light, because of the alignment of the molecules of the emissive layer produced by the grating. When a device of the invention is used as, for example, the back-light to illuminate a transmissive LC display, the rear polariser is unnecessary and can be omitted.

A light emitting device of the invention may also be used as an image display element, for example if the light-emitting device contains a plurality of independently addressable picture elements (or "pixels") and so can be addressed to display one or more image. As an example, a light-emitting device of the invention may be used as the image display element in a stereoscopic display device. The combination of polarised emission and a short radiative lifetime overcomes many of the problems of conventional stereoscopic display devices described above.

The use of a grating to align the active layer means that it is not necessary to provide a conventional alignment layer, even when the active layer includes a material having a liquid crystalline phase. Thus a device having good electrical properties can be obtained, since it is not necessary to include an electrically insulating alignment layer in the device structure.

A light-emitting device of the present invention overcomes another problem that affects conventional planar light-emitting device structures including OLEDs. This problem is illustrated in FIG. 1, which is a schematic sectional view of a typical OLED.

The OLED 1 of FIG. 1 has a transparent substrate 2, for example a glass substrate. A first electrode 3 (in this example a transparent anode), an organic light-emissive layer 4, and a second electrode 5 (in this example a cathode) are disposed in this order over the substrate. It is intended that the OLED 1 should emit light through the bottom face 6 of the substrate. A reflector is therefore provided above the emissive layer 4, so that light emitted in an upwards direction by the emissive layer is reflected back towards the bottom face 6 of the substrate 2; in the OLED of FIG. 1 the reflector is conveniently provided by making the second electrode 5 a reflective electrode.

The organic emissive layer 4 will generally have a relatively high refractive index, and a refractive index in the range of 1.7-2 for the organic layer 4 is not unusual. The refractive index of the organic layer 4 is thus higher than the refractive index of the transmissive electrode 3 or the refractive index of the substrate 2, and these in their turn are higher than the refractive index of the surrounding air. Thus, while some light emitted by the emissive layer 4 will pass out of the device through the bottom face 6 of the substrate as shown by path (a) in FIG. 1, some light will be incident on an interface within the device at an angle to the normal that is greater than the critical angle, and so will undergo total internal reflection and be trapped within the OLED 1. In the OLED 1 of FIG. 1, internal reflection may occur at the substrate/air interface (i.e., at the bottom face 6 of the substrate) as shown by path (b), at the interface between the transparent first electrode 3 and the substrate 2 as shown by path (c) or at the interface between the emissive layer 4 and the transparent first electrode 3 as shown by path (d). Thus, the OLED 1 acts as a waveguide. M.-H. Lu et al. have shown, in "J. Appl. Phys". 91(2) pp595-604 (2002), that a substantial fraction of emitted light is trapped in waveguide modes rather than being emitted in the desired direction. This light is not emitted in the intended viewing direction for the OLED and there is therefore a loss of overall efficiency of the device.

In a device of the present invention, however, the grating reduces the propagation of waveguide modes, and also scatters light out of the device by Bragg scattering. This enhances the useful light output of the device.

It is known to provide a diffraction grating within a light-emitting device, but such gratings have never been used to align a light-emissive region in order to obtain polarised output light. For example, U.S. Pat. No. 6,476,550 discloses an organic electroluminescent device which is provided with a diffraction grating. The diffraction grating is provided to increase the optical efficiency of the device, by diffracting light out of the device and so preventing light being trapped by total internal reflection within the device. However, in U.S. Pat. No. 6,476,550 the emissive layer of the OLED is not aligned by the grating so that light output from the OLED is unpolarised.

As further example, GB-A-2 318 422, GB-A-2 312 523 and GB-A-2 301 195 disclose conventional liquid crystal cells in which one cell wall is provided with an alignment grating. The grating is provided to, for example, stabilise two liquid crystal states at the surface (GB 2 318 422), or to provide a locally varying pre-tilt (GB 2 312 523).

The grating may be defined in the substrate. In this embodiment, the grating may be defined by removing material from selected areas of the substrate.

Alternatively, the grating may be defined by material deposited on selected areas of a surface of the substrate. The material deposited on the surface of the substrate comprises two or more strips extending substantially parallel to one another. The material deposited on the surface of the substrate may comprise a photoresist.

The device may comprise an electrode for addressing the light-emissive layer, and the grating may be defined in the electrode.

The device may further comprise an organic layer, and the grating may be defined in the organic layer. The organic layer may be a transport layer.

The grating may have no faces that are substantially perpendicular to the plane of the substrate. This allows an electrode to be deposited over the grating without risk of the electrode being formed in discontinuous sections. The grating may have a cross-section that is substantially sinusoidal.

The pitch of the grating may be at least 100 nm, and it may be less than 20 μm.

The height of the grating may be at least 20 nm, and it may be less than 1 μm.

The grating may align substantially the entire area of the light-emissive layer in a first direction. In this case, substantially the entire emissive area of the device will emit light of a single polarisation.

Alternatively, the grating may align a first region of the light-emissive layer in a first direction and may align a second region of the light-emissive layer in a second direction different from the first direction. In this case, the first region will emit light that is plane-polarised parallel to the first direction and the second region will emit light that is plane-polarised parallel to the second direction.

The first direction may be at substantially 90° to the second direction.

The device may comprise a plurality of individually addressable pixels.

A second aspect of the invention provides an image display system comprising a light-emitting device in which the grating aligns substantially the entire area of the light-emissive layer in a first direction. The light-emitting device may be pixelated. Such a display device may be a passive stereoscopic display device, an active stereoscopic display device, or a 2-D display device.

A third aspect of the invention provides an image display system comprising a light-emitting device in which the grating aligns a first region of the light-emissive layer in a first direction and aligns a second region of the light-emissive layer in a second direction different from the first direction. The light-emitting device may be pixelated. Such a display device may be a passive stereoscopic display device, an active stereoscopic display device, or a 2-D display device.

The light-emitting device may form, in use, an image display element of the image display system Alternatively, the image display may further comprise an image display element, and the light-emitting device may form, in use, a backlight for the image display element.

The image display system may further comprise a switchable retarder disposed in the optical path between the light-emitting device and the image display element. The image display system can be switched between a 2-D display mode and a 3-D display mode by appropriately switching the retarder. The retardation of the switchable retarder may be switchable between 0 and λ/2.

For one retardation state of the switchable retarder, the optic axis of the switchable retarder may be arranged such that light from the first and second regions of the emissive layer exit the switchable retarder polarised at substantially 90° to one another. Where the light-emitting device constitutes a back-light for an image display element that incorporates a linear polariser, this makes it possible for the transmission axis of the input polariser of the image display element to be arranged at approximately 45° to the plane of polarisation of light from both the first region and the second region when it exits the switchable retarder so that the image display element 34 passes light from the first region and the second region with substantially equal intensities.

The image display system may alternatively comprise a retarder movable between a first position in which the retarder is disposed in an optical path between the device and the image display element and a second position. The image display system can be switched between a 2-D display mode and a 3-D display mode by appropriately moving the retarder. The retardation of the retarder may be substantially λ/2.

When the retarder is in the first position, the optic axis of the retarder may be arranged such that light from the first and second regions of the emissive layer exit the retarder polarised at substantially 90° to one another. The first direction may be at substantially +45° to a reference direction, the second direction may be at substantially −45° to the reference direction, and the optic axis of the retarder may be at substantially +22.5° to the reference direction.

BRIEF DESCRIPTION OF THE DRAWINGS

Preferred embodiments of the present invention will now be described by way of illustrative example with reference to the accompanying figures in which:

FIG. 9(a) shows the chemical structure of oxetane-bis-functionalised N,N,N',N' tetraphenyl-benzidine;

FIG. 9(b) shows the polymerisation of oxetane groups;

FIG. 10 shows the chemical structure of poly(9,9-bis(2-ethylhexyl)fluorine (PF2/6);

FIG. 16(a) shows a stereoscopic display device incorporating the light-emitting device of FIG. 15(a);

FIG. 17 shows the operation of another stereoscopic display device incorporating the light-emitting device of FIG. 15(a)

DESCRIPTION OF THE PREFERRED EMBODIMENTS

Figure 2:
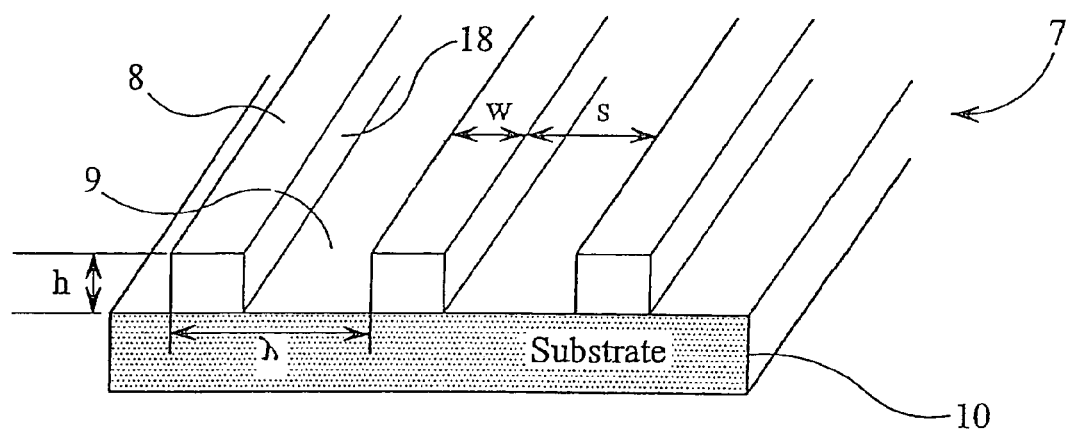
FIG. 2 shows a schematic drawing of a grating.

FIG. 2 illustrates a typical grating 7. It consists of a series of lines 8 which are arranged substantially parallel to one another and have a uniform width w. Each pair of adjacent lines 8 is separated by a space 9, that has a substantially uniform widths. The grating structure 7 is defined on a substrate 10. The lines 8 may be considered as being raised above the surface of the substrate 10 or, alternatively, the spaces 9 between adjacent pairs of lines may be considered as grooves in the substrate.

The grating 7 may be defined in terms of the height h of the lines 8 above the spaces, and by the pitch $\lambda$ of the grating. The pitch of the grating is defined as the sum of the width of one line 8 and the width of one space 9:—that is, $\lambda = w + s$.

Figure 3:
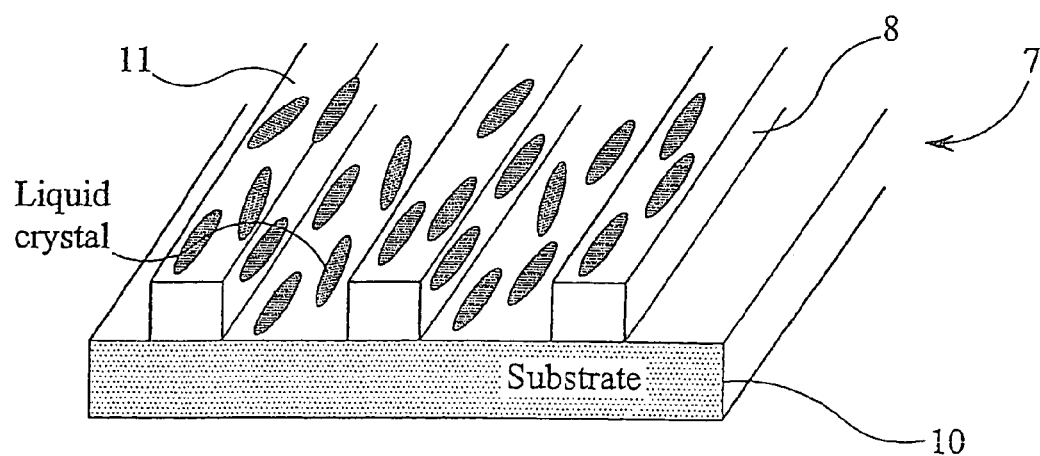
FIG. 3 is a schematic illustration of a liquid crystalline material aligning with the lines of the grating of FIG. 2.

The principle of the present invention is to incorporate a grating similar to the grating 7 of FIG. 2 in a light-emitting device. The grating serves to align the molecules of the light-emissive layer of the device. This is illustrated in FIG. 3, which shows the effect of disposing a layer containing liquid crystal molecules over the grating 7 of FIG. 2. As can be seen in FIG. 3, the liquid crystal molecules 11 are aligned so as to be substantially parallel to the lines 8 of the grating 7. Thus, providing a grating 7 in a light-emitting device in which the light-emissive layer contains liquid crystal molecules or other molecules that can be aligned by the grating, leads to a light-emitting device that has an aligned light-emissive layer. In consequence of the alignment of the light-emissive layer by the grating structure, the device emits, in use, light that is at least partially plane-polarised. In the case of complete alignment of the light-emissive layer, the output light would be completely plane polarised parallel to the alignment direction of the emissive layer (ie, parallel to the direction in which the grating lines extend). In practice, the emissive layer is unlikely to be completely aligned so the output light will partially plane polarised parallel to the alignment direction of the emissive layer rather than completely plane-polarised. The greater the degree of alignment of the light-emissive layer that is induced by the grating, the greater will be the dichroic ratio of the device.

The pitch $\lambda$ and height h of the grating 7 are chosen to provide good alignment of the emissive layer of a particular device. In general, the required pitch is likely to be at least 100 nm, and is likely to be no more than 20 µm. The line width is typically no more than 1 µm, and a large pitch is preferably obtained by keeping the line width to no more than approximately 1 µm and choosing the line spacing appropriately. The required height of the grating will typically be from a few tens of nanometers. The maximum desirable height is likely to be of the order of 1 µm. A grating height in this range should provide effective alignment of liquid crystal molecules, while still being compatible with operation of a light emitting device.

Kawata et al have reported, in "Liquid Crystals" 16 (6) pp 1027-1036 (1994), almost completely uniform alignment of a typical liquid crystal material (the liquid crystal material 5 CB) using a grating that had a pitch of 2 µm and a line spacing of 1 µm. The pre-curing thickness of the grating was in the range of 300 nm to 1,000 nm.

FIG. 3 illustrates a grating 7 aligning a liquid crystal material that is in direct contact with the grating 7. If one or more layers are disposed over a grating 7 then, provided that the layers are not so thick as to totally bury the grating, the overlying layer(s) will exhibit some grating features that derive from the grating 7, and these residual grating features will be effective to align the liquid crystal material. This provides considerable freedom in designing the light-emitting device of the invention. Where the grating is covered by overlying layers, as in FIG. 3, the overlying layers will "smooth out" the grating to some extent. The preferred range for the grating height of from a few tens of nanometers to a maximum of the order of 1 µm applies to the underlying grating 7 rather than to the residual grating features in the overlying layer.

Figure 7:
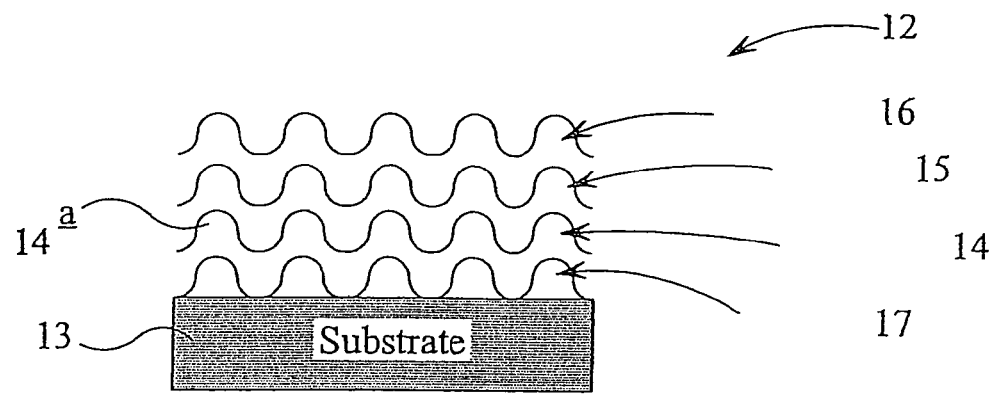
FIG. 7 is a schematic cross-sectional view of another light-emitting device according to the present invention.

FIG. 7 is a schematic illustration of one light-emitting device according to the present invention. This device is an OLED and, as for the conventional OLED of FIG. 1, comprises a substrate 13. A first electrode 14, an emissive layer 15, and a second electrode 16 are disposed, in this order, over the substrate. The OLED of FIG. 7 additionally comprises a grating 17, which is disposed between the substrate 13 and the first electrode 14. The first electrode 14 disposed over the grating 17 is relatively thin, and the electrode 14 therefore displays raised lines 14a derived from the lines of the grating 17. The emissive layer 15 contains liquid crystal molecules, or other molecules that can be aligned by the grating, and the residual grating lines 14a in the first electrode 14 are effective at aligning the molecules of the emissive layer 15. In consequence of the alignment of the light-emissive layer by the grating structure, the device emits, in use, light that is at least partially plane-polarised.

Figure 4:
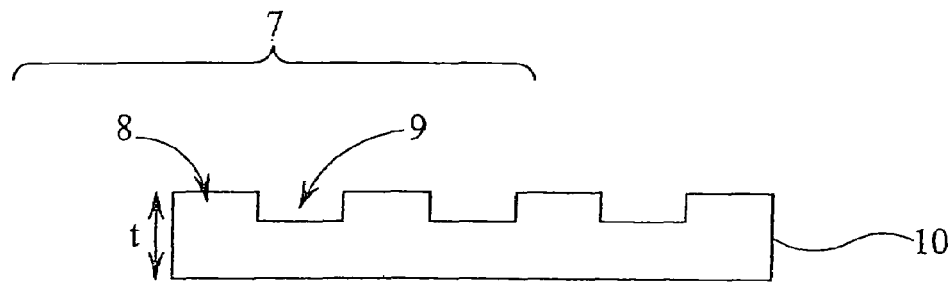
FIG. 4 shows a substrate for a light-emitting device of the present invention.

The lines 8 of the grating 7 of FIG. 2 have side faces 18 that are substantially perpendicular to the faces of the substrate, and so are substantially vertical when the substrate is in its normal, intended orientation. It might therefore be extremely difficult to dispose an electrode layer over the grating 7 of FIG. 2—it would be straightforward to deposit electrode material on the upper surfaces of the lines 8 and on the spaces, but it could be very difficult to deposit electrode material on the vertical side faces 18 of the lines. If an electrode layer were deposited over the grating 7 of FIG. 2, it is possible that the result would be a series of disconnected strips of electrode material. Whether the electrode layer can be deposited satisfactorily will depend primarily on the height of the grating relative to the thickness of the emissive layer—if the grating height is low relative to the thickness of the emissive layer it should be possible to deposit the electrode layer satisfactorily as a result of the "smoothing-out" effect mentioned earlier. Where an electrode layer is to be deposited over the grating, as in the OLED of FIG. 7, for example, it is therefore preferable that the grating does not contain faces that are perpendicular to the plane of the substrate. In the OLED of FIG. 7, for example, the grating 17 has a cross-section that is substantially sinusoidal. This grating has no vertical faces, and so it is possible to deposit the first electrode 14 with a uniform thickness over the entire area of the grating 17. Alternatively, the grating lines could have side faces that are substantially planar but that are inclined, not perpendicular, to the surface of the substrate.

Where a grating is provided on the substrate of the OLED, as in the OLED of FIG. 7, it may be defined in the substrate, as shown in FIG. 4. A grating of the type shown in FIG. 4 may be manufactured from a substrate having a uniform thickness t, and removing selected areas of the substrate in order to define a grating in the substrate. This may be done by, for example, etching a glass or plastics substrate so as to define a grating in the substrate. Alternatively, in the case of a plastics substrate, the substrate may be moulded using a suitable mould. As a further alternative the grating may be formed by embossing the grating into the substrate, and this method again may be applied to a plastics substrate.

Figure 5:
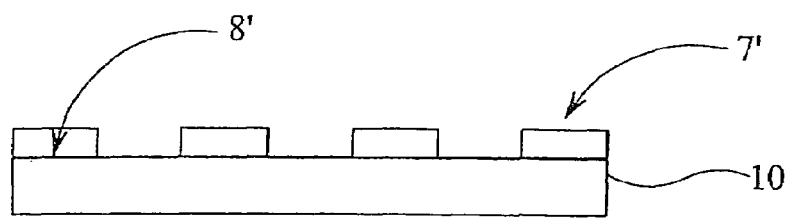
FIG. 5 shows another substrate for a light-emitting device of the present invention.

FIG. 5 illustrates another method of manufacturing a substrate having a grating. In FIG. 5, the grating 7' is formed by depositing material onto selected areas of a surface of a substrate 10 having uniform thickness. The material is preferably deposited to form a series of parallel grating lines 8'. In this method, the grating lines 8' may be lines of photoresist deposited on the substrate 10. This grating may be manufactured by a conventional process of depositing photoresist over the entire surface of the substrate 10, illuminating the photoresist through a suitable mask, and removing un-exposed photoresist.

Although FIGS. 4 and 5 both show gratings in which the lines have side faces that are substantially perpendicular to the plane of the substrate and so are vertical when the grating is in its intended orientation, the techniques described with reference to these figures may be used to produce gratings that do not have vertical faces. In particular, these techniques may be applied to produce a grating having a substantially sinusoidal cross-section such as the grating 17 in FIG. 7.

Figure 6:
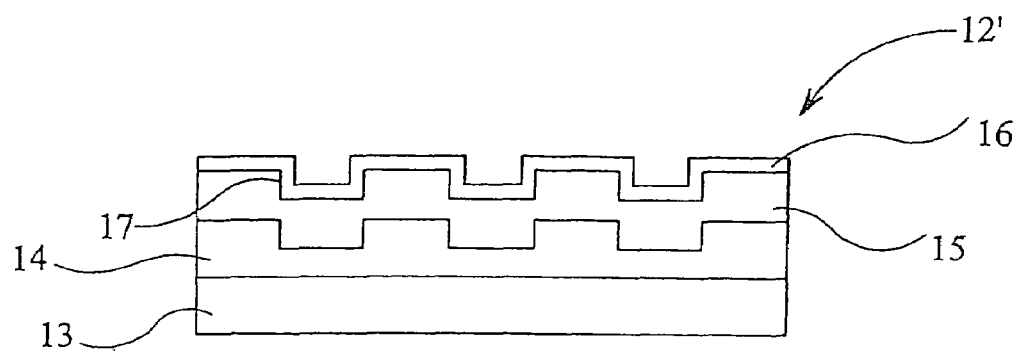
FIG. 6 is a schematic cross-sectional view of a light-emitting device according to the present invention.

As mentioned above, the grating is not limited to being formed in or on the substrate of the light-emitting device of the present invention. The grating may be formed in other layers, and FIG. 6 illustrates a light-emitting device of the invention in which the grating is formed in the lower electrode of the light-emitting device. This device is an OLED 12' and, as shown in FIG. 6, comprises a substrate 13, and a first electrode 14, an emissive layer 15 and a second electrode 16 disposed in this order over the substrate 13. A grating 17 is defined in the first electrode 14. The grating may be manufactured by initially depositing the electrode layer with a uniform thickness over its area, and then etching selected areas of the electrode layer to reduce their thickness. The areas of the electrode layer that are not etched define the grating lines, and the areas of reduced thickness define the grating spaces between the grating lines. One suitable material for the electrode layer 14 is indium tin oxide (ITO). The grating aligns, in use, the molecules of the emissive layer 15 (the emissive layer 15 again contains liquid crystal molecules, or other molecules that can be aligned by the grating). In consequence of the alignment of the light-emissive layer by the grating structure, the OLED of FIG. 6 will therefore emit, in use, light that is at least partially plane-polarised.

(FIG. 6 shows the side faces of the grating 17 as being vertical. The side faces of the emissive layer 15 are also shown as vertical for ease of explanation although, in practice, some smoothing out of the grating may occur so that the side faces of the emissive layer 15 are not exactly vertical. As explained above, deposition of the upper electrode layer 16 may be possible, despite the vertical faces of the grating, if the height of the grating is small compared to the thickness of the emissive layer 15. Alternatively, a grating that does not have vertical side faces may be used.)

Figure 1:
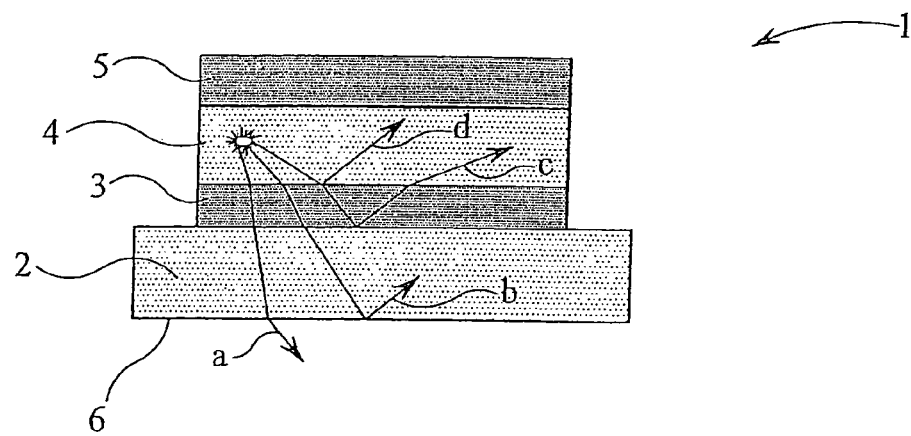
FIG. 1 is a schematic illustration of an OLED showing the out-coupling of light with a substantial fraction of emitted light trapped in wave guiding modes.
Figure 8:
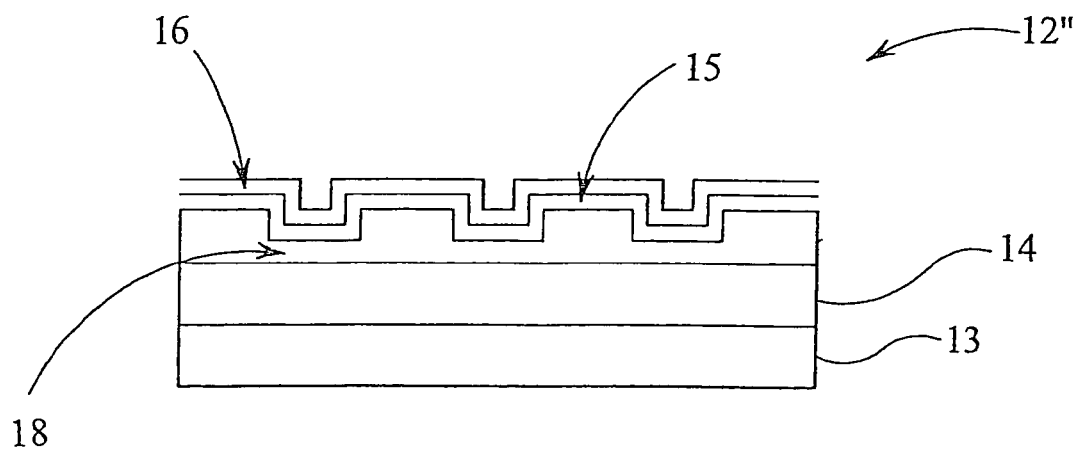
FIG. 8 is a schematic cross-sectional view of another light-emitting device according to the present invention.

In general, an organic light-emitting device such as an OLED will contain one or more organic layers in addition to the layers shown in FIG. 1. FIG. 8 shows a further embodiment of a light-emitting device of the invention in which an organic transport layer 18 is provided between the lower electrode 14 and the emissive layer 15. This embodiment is again described with reference to an OLED.

The organic layer 18 is, in this example, a hole transport layer. In the OLED 12" of FIG. 8, a grating is defined in the upper surface of the organic layer 18. The grating in the upper surface of the organic layer 18 again is effective at aligning molecules of the emissive layer (the emissive layer 15 again contains liquid crystal molecules, or other molecules that can be aligned by the grating). Inconsequence of the alignment of the light-emissive layer by the grating structure, the OLED 12" of FIG. 8 will therefore emit, in use, light that is at least partially plane-polarised.

In order to manufacture the OLED 12" shown in FIG. 8, the organic layer 18 should, firstly, be able to be patterned by removing material in order to define the grating. The organic layer 18 should, furthermore, be resistant to the deposition of the subsequent layers. One example of an organic material that can be used as the hole transport layer in the OLED of FIG. 8 is oxetane-bisfunctionalised N,N, N'N' tetraphenyl-benzidine. The structure of this material is shown in FIG. 9(a), and the material is a derivative of one of the most common organic hole conductors N,N'-bis(4-methylphenyl) N,N' diphenyl-benzidine or TPD. The oxetane groups are polymerisable moieties that can be photo-reacted in a layer that has been deposited, for example, by spin-coating. The photo-polymerisation reaction is shown in FIG. 9(b). Since each molecule contains two polymerisable oxetane groups, as shown in FIG. 9(a), photo-polymerisation process will produce a cross-linked network. As described in co-pending UK patent application No. 0226231.9, the cross-linking reduces the solubility of the material—the cross-linked material is essentially insoluble, and therefore forms a suitable base on which further layers may be deposited.

Thus, to produce the OLED 12" of FIG. 8, a transparent electrode 14 is initially deposited over the substrate 13, and this may be carried out in any conventional way. For example, an ITO layer may be deposited over the substrate 13 to act as the first electrode 14. A layer of oxetane-bisfunctionalised N,N,N',N' tetraphenyl-benzidine is then deposited over the first electrode 14. This layer may be patterned in a similar way to the patterning of negative photo-resist. In brief, the layer is exposed to ultra-violet radiation through a suitable mask. The UV-exposed regions become insoluble, and form the lines of the grating in the patterned transport layer 18. The unexposed regions remain soluble, and can be washed away to form the spaces between the lines of the grating. The light-emissive layer 15 and the upper electrode 16 may then be deposited by any suitable process.

In principle the transport layer 18 be completely washed away between the lines of the grating. In FIG. 8, however, the transport layer 18 is not completely washed away between the lines of the grating so that regions of reduced, but non-zero, thickness are formed as shown in FIG. 8. One way of obtaining regions of reduced, but non-zero, thickness is to spin down a complete layer of the material and cross-link it to make it insoluble. Then a second layer is spun down and is patterned as described above. The second layer may be completely washed away in regions where it was not exposed to UV radiation, but the first layer would not be affected. Another method would be to partially cross-link all of the film with UV light initially, and then completely cross-link the areas that were intended to form the lines of the grating. In the washing step the partially cross-linked regions of the film should wash away—but at a rate slower than the rate at which a completely uncross-linked film would wash away. The extent to which the partially cross-linked regions were washed away could be controlled by controlling the duration of the washing step.

In order to demonstrate the present invention, a grating was deposited on a substrate. A layer of photo-resist (SUB-2002 from MicroChem) was deposited by spin-coating onto a clean transparent substrate. A sheet of glass was used as the substrate, although a plastics material such as polyethylenetelephthalate (PET) or polysulfone (PS) could alternatively have been used as the substrate. The resist was soft baked at 65° C. for one minute, and for 95° C. for three minutes.

The layer of photo-resist was then exposed to ultra-violet light through an amplitude mask, in order to define a grating in the photo-resist layer. A typical mask aligner has several grating patterns etched on it, varying from 1-3 μm line width and 1-3 μm space width; a suitable grating pattern may be selected for a particular device. A typical exposure time is 60 seconds.

The exposed layer of photo-resist is post-exposure baked at 65° C. for one minute and at 95° C. for three minutes. It is then developed in solvent (EC solvent from Shipley) for one minute, and is finally rinsed in isopropyl alcohol (IPA) before drying. In this development process, the amplitude pattern of the mask is transferred to the surface profile of the photo-resist layer, so that a diffraction grating is defined in the photo-resist layer. The photo-resist layer may then be hardened by baking it in an oven at a temperature of around 150° C. for 30 minutes.

The grating produced in one embodiment had a grating height of around 200 nm. The profile of the grating was substantially square-shaped. It is possible however to modify the height and shape of the grating, by changing conditions of the processing of the photo-resist such as the spin-speed during deposition of the photo-resist, the UV exposure time, or the development time. Changing the particular photo-resist used will also modify the height and shape of the gratings.

The substrate and diffraction grating such produced was incorporated in an OLED having the general structure shown in FIG. 7. The emissive layer of the OLED was an emissive polymer having a liquid crystal phase. The polymer poly (9,9-bis(2-ethylhexyl)) fluorine, generally known as "PF2/6" and commercially available from H W Sands, Florida USA, was used for the emissive layer. The structure of PF2/6 is shown in FIG. 10. This polymer was chosen because it is known from D Neher in "Macromol. Rapid. Commun." 22 (17) pp1365-1385 (2001) to show good alignment using other techniques. The polymer was dissolved in toluene at 10 mg/ml, passed through a 0.2 μm filter, and was spun-coated onto the grating substrate. A film thickness of approximately 100 nm was used. The substrate and polymer layer were then heated to 160° C. (a temperature at which PF2/6 possesses a (nematic) liquid crystalline phase) for 30 minutes to induce alignment of the liquid crystal molecules. The device was then cooled slowly to room temperature to maintain the alignment.

The degree of liquid crystal alignment induced by the grating was assessed in two ways, by investigating both the emission and absorption properties of the device. The degree of alignment was determined by photoluminescence and optical absorption, since electrode layers were not provided in the device.

To investigate the emission properties of the device, the device was positioned in a spectrafluorimeter, with the lines of the grating being substantially vertical. The device was excited with unpolarised light at wavelength of 375 nm, which is in the centre of the absorption peak of PF2/6 and the emission spectrum (i.e., the photoluminescence spectrum) was recorded. A plane polariser was positioned between the sample and the detector. When the transmission axis of the polariser is vertical, the detector records emitted light that is polarised in the vertical direction (that is, parallel to the direction of the grating, and so parallel to the alignment direction). When the polariser is positioned with its transmission axis horizontal, the detector records the light emitted with a polarisation perpendicular to the direction of the grating.

Figure 11:
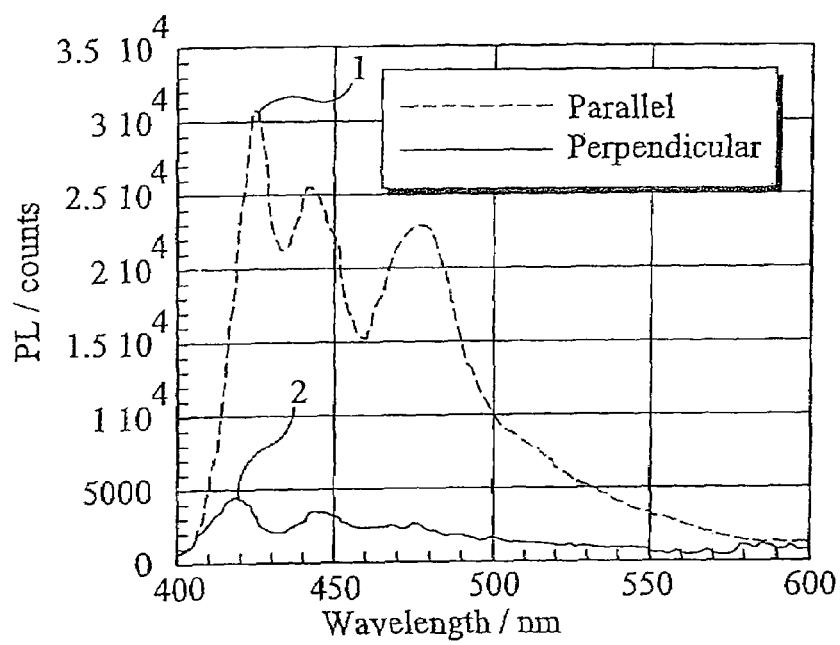
FIG. 11 shows typical PL spectra of a light-emitting device according to the present invention measured with a polariser positioned parallel and perpendicular to the grating direction.

The emission spectra of the device are shown in FIG. 11. Trace (1) in FIG. 11 shows the recorded spectrum for light polarised parallel to the direction of the grating, and trace (2) in FIG. 11 shows the spectrum of light polarised perpendicular to the grating direction. It is clear from FIG. 11 that the grating has produced significant alignment of the emissive layer, since the intensity of emitted light polarised parallel to the grating direction is significantly higher than the intensity of the emitted light polarised perpendicular to the grating direction. The dichroic ratio D was approximately 7, although it is difficult to determine a precise value for the dichroic ratio owing to the grating interacting with the exciting beam and causing some spurious reflections.

Figure 12:
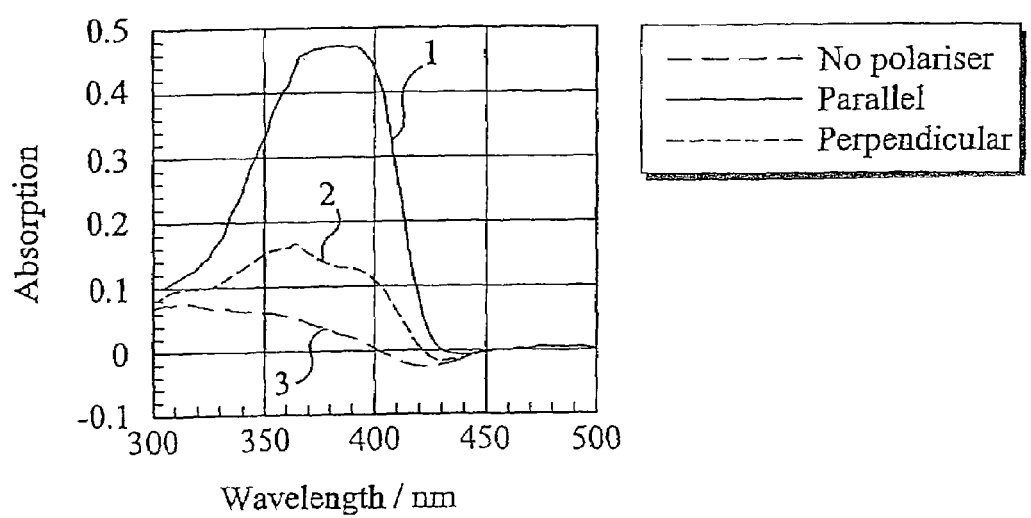
FIG. 12 shows typical absorption spectra for a light-emitting device according to the present invention measured with no polariser, a parallel aligned polariser, and a perpendicular aligned polariser.

FIG. 12 illustrates typical absorption spectra measured for the device. Trace (1) in FIG. 12 shows the absorption of light passing through the device when no polariser is interposed between the light source and the device, trace (2) shows the absorption spectrum when a polariser with its transmission axis aligned parallel to the grating is interposed between the light source and the device, and trace (3) in FIG. 12 shows the absorption spectrum obtained with a polariser aligned with its transmission axis perpendicular to the grating direction interposed between the light source and the device. It will be seen that there is significantly more absorption of light polarised parallel to the grating than of light polarised perpendicular to the grating. These measurements give an approximate value for the dichroic ratio of 10.

The results of FIGS. 11 and 12 clearly indicate that the grating on the substrate is effective at aligning the liquid crystal molecules of the PF2/6 emissive layer.

Figure 13:
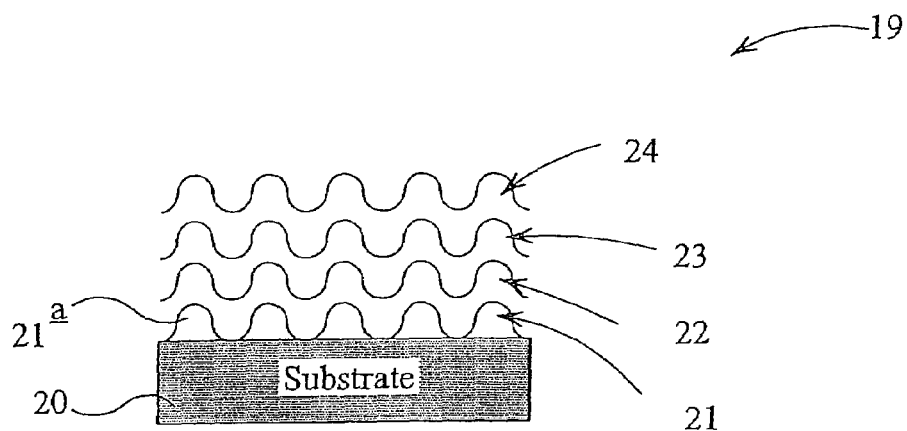
FIG. 13 is a schematic view of another light-emitting device according to the present invention.

FIG. 13 illustrates one way in which a grating may be incorporated into a light-emitting device. This embodiment is described with reference to an OLED, and the OLED 19 of FIG. 13 incorporates a photoresist grating 21 disposed on a substrate 20. The grating may be formed using the method described with reference to FIG. 5 above, so as to comprise parallel lines 21a of photoresist disposed on the substrate 20.

A thin, semi-transparent layer of gold 22 is disposed over the grating. This layer will act as an electrode (in this case the anode). The lines 21a of the grating preferably do not have vertical side faces, to allow the gold layer to be deposited with a uniform thickness. Preferably, the grating 21 has a cross-section that is approximately sinusoidal.

A layer of PF2/6 is disposed over the gold anode 22, and this will form the emissive layer. Since the gold layer is thin, lines derived from the grating lines 21a are present in the surface of the gold layer facing the emissive layer, and these will align the molecules of the emissive layer.

Finally, a layer of calcium topped with aluminium 24 is disposed over the emissive layer. This layer will act as another electrode (in this case the cathode).

In the OLED 19 of FIG. 13, the molecules in the PF2/6 emissive layer are aligned by the grating 21. As a result, the device will emit polarised light. Furthermore, the grating 21 will reduce the amount of emitted light that is trapped within the device, by reducing waveguiding effects and also by Bragg scattering light out of the device.

The use of a grating to align the molecules of the emissive layer has a further advantage over the use of conventional alignment layers. As is well-known, when a liquid crystal material is aligned by an alignment layer such as a rubbed polyimide layer, the liquid crystal layer imparts a "pre-tilt" angle to liquid crystal molecules near the alignment layer. Thus, the plane of the liquid crystal molecules is not parallel to the surface of the alignment layer, but is tilted with respect to the alignment layer. According to the present invention, however, when a grating is used to align liquid crystal molecules of an emissive layer, the molecules will be aligned generally parallel to the surface of the grating. That is, in the light-emitting devices of FIG. 7 or 13, for example, the liquid crystal molecules will be aligned substantially parallel to the substrate 13, 20. This means that light generated by the emission layer is preferentially propagated down towards the bottom surface of the substrate, since the light propagation direction will be orthogonal to the plane of the emissive molecules. In an light-emitting device of the invention, therefore, more light is propagated along the desired emission direction, so that the useful light output of the device is greater than the useful output of conventional devices.

The devices described with reference to FIGS. 6, 7, 8 and 13 above may if desired be embodied as pixellated devices in which the active area of the device is formed into a plurality of individually addressable pixels. As is well-known, this maybe done by making one of the electrodes 14,16 as a plurality of discrete, individually controllable pixel electrodes.

Figure 14A:
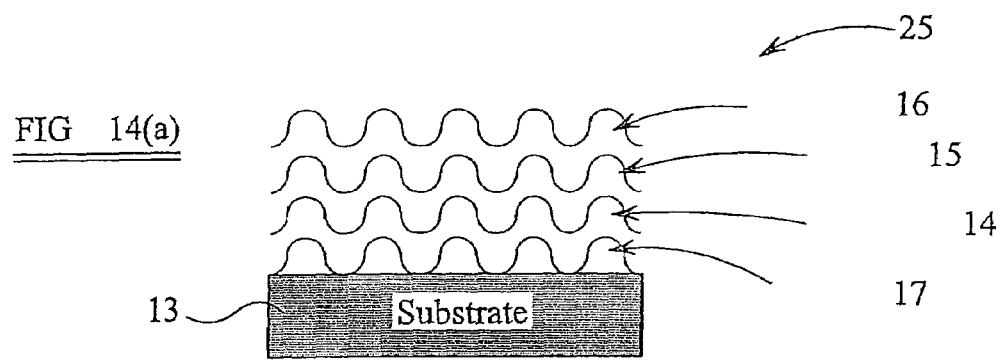
FIG. 14(a) shows another light-emitting device of the invention.
Figure 14B:
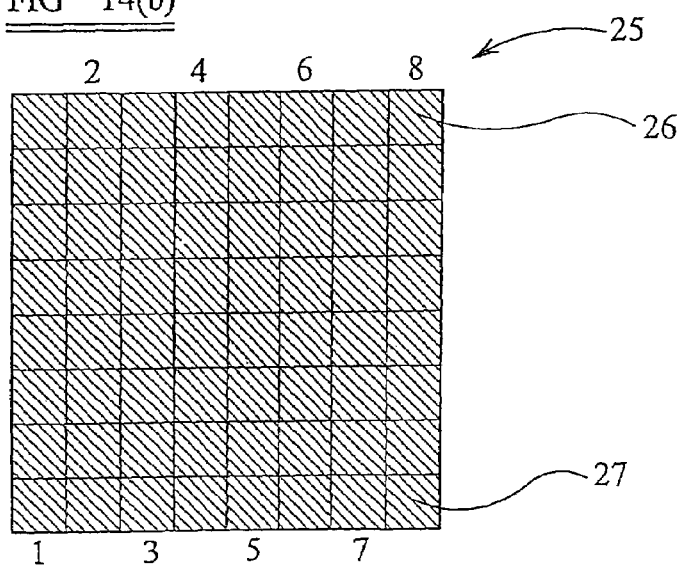
FIG. 14(b) is a plan view of the grating structure of the light-emitting device of FIG. 14(a)

FIGS. 14(a) and 14(b) show a further embodiment of a light-emitting device of the present invention. This embodiment will be described with reference to an OLED. FIG. 14(a) is a cross-sectional view of the OLED 25, and it will be seen that the OLED 25 comprises a grating structure 17 disposed on substrate 13. A first electrode 14, an emissive layer 15 and a second electrode 16 are disposed over the grating structure 17. FIG. 14(a) shows the grating structure 17 disposed on the substrate 13, but the grating structure may be formed in the OLED 25 in any of ways described above. The grating structure orients the molecules of the emissive layer, as explained above. The OLED 25 of FIG. 14(a) therefore emits polarised light.

As shown in FIG. 14(b), which is a plan view of the OLED 25, the OLED 25 is a pixelated device. That is, the active area of the device is formed into a plurality of individually addressable pixels 26. FIG. 14(b) shows the pixels 26 arranged in an 8×8 matrix, but the invention is not limited to this specific arrangement. The pixels may be defined by making one of the electrodes 14, 16 not as a continuous electrode but as a plurality of discrete, individually controllable pixel electrodes each provided with a respective switching element, and this is indicated in FIG. 14(a) which shows the second electrode 16 as a series of individual pixel electrodes. The switching elements are not shown in FIG. 14(b).

The lines 27 in FIG. 14(b) indicate the raised portions of the grating of the OLED. The lines 27 are formed such that every pixel 26 of the OLED 25 has (ignoring fabrication errors) the same grating relief direction and so has the same liquid crystal orientation. As a result, every pixel 26 of the OLED 25 emits light with a nominally identical polarisation state. One convenient way of ensuring that every pixel 26 of the OLED 25 has the same grating relief direction is to make the lines 27 continuous across the area of the OLED 25, as shown in FIG. 14(b). However, the lines 27 are not required to be continuous across the area of the OLED 25.

In FIG. 14(b) the grating relief direction (as represented by the lines 27) is at approximately 45° to the direction of the pixel columns and pixel rows, but the grating relief may extend along any desired direction.

The emissive layer 15 of the OLED 25 of FIGS. 14(a) and 14(b) may be, for example, a layer of a material that contains liquid crystal molecules (or other molecules that can be aligned by the grating).

The pixelated OLED of FIGS. 14(a) and (b) can be used as, for example, the display element of a conventional 2-D display or as a backlight for a display element. However, the pixelated OLED of FIGS. 14(a) and (b) can also be used as the display element in a passive stereoscopic display device, or as the display element in an active stereoscopic display device. Using the OLED 25 as the display element in a stereoscopic display device has a number of advantages over conventional stereoscopic display devices.

As explained above, the light-emitting device of FIGS. 14(a) and (b) emits light that has a substantially uniform polarisation over the entire area of the device. There is therefore no need to provide an external polariser when the light-emitting device is used as the display element in a stereoscopic display device (this applies to both passive and active stereoscopic display devices). In the case of a passive stereoscopic device, this reduces the cost and bulk of the system, and in the case of an active stereoscopic display device this reduces the cost and bulk of the active glasses worn by an observer.

Since no external polariser is required, the intensity loss that occurs when a polariser is used is eliminated. It is therefore possible to provide a display having increased brightness, and/or reduce the drive current required for the light-emitting device thereby increasing the lifetime of the light-emitting device. This applies when the device is operated in either a 2-D mode or a 3-D mode.

The radiative relaxation time of a liquid crystal OLED is generally much shorter than the radiative decay time of a CRT phosphor. Use of an OLED therefore reduces cross-talk between the two eye images, and also reduces brightness variations along a column of pixels.

Finally, a stereoscopic display device that incorporates the light-emitting device 25 of FIGS. 14(a) and (b) will provide a good image when used as a 2-D display. The brightness variations or colour artefacts that occur in the prior art microcavity display do not occur when an display incorporating light-emitting devices of the invention is used.

The OLED 25 of FIGS. 14(a) and 14(b) emits light that is linearly polarised. If it is desired to use the OLED 25 in a stereoscopic display device based on circularly polarised light rather than linearly polarised light, a uniform $\lambda/4$ retarder can be inserted between the OLED display and the observer's viewing glasses or can be incorporated in the observer's viewing glasses.

Figure 15A:
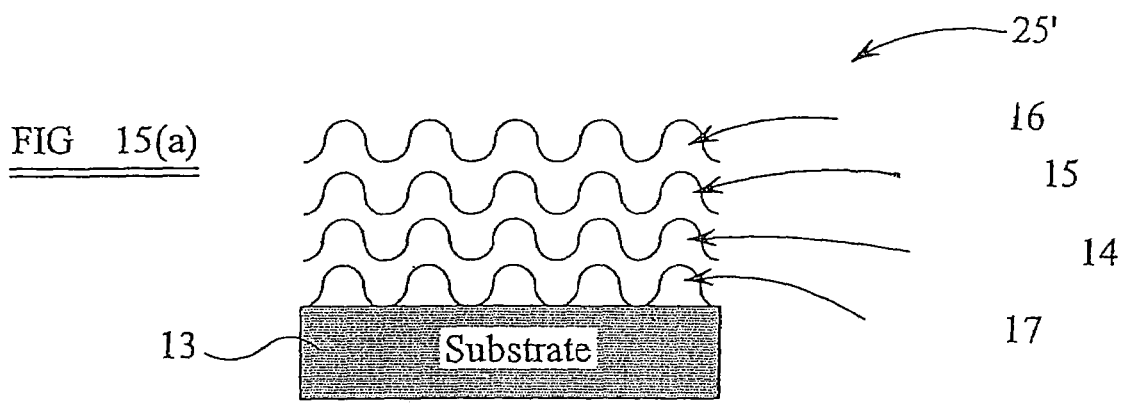
FIG. 15(a) shows another light-emitting device of the invention.
Figure 15B:
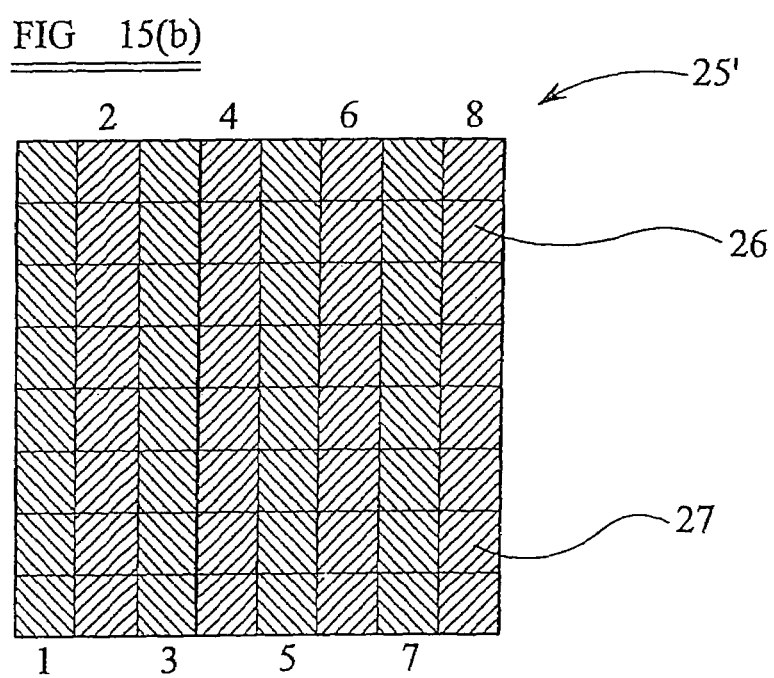
FIG. 15(b) is a plan view of the grating structure of the light-emitting device of FIG. 15(a)

FIGS. 15(a) and 15(b) shows a further embodiment of a light-emitting device of the present invention. This embodiment will be described with reference to an OLED. FIG. 15(a) shows the OLED in cross-section; FIG. 15(a) is identical to FIG. 14(a) and will not be described further. The OLED 25' of FIGS. 15(a) and 15(b) is again a pixelated device that comprises a plurality of independently addressable pixels 26. FIG. 15(b) shows the OLED 25' in plan view and shows the device having 64 pixels arranged in an 8×8 matrix, but the invention is not limited to this particular number and/or arrangement of pixels.

The lines 27 in FIG. 15(b) again indicate the direction of the grating relief structure in the pixels. It will be seen that, unlike the light-emitting device of FIG. 14(b), the grating relief direction is not uniform over the light-emitting device of FIG. 15(b) but varies between pixels. In this embodiment, the grating relief direction is constant for all pixels in a column, but varies between one column and the next column. In the preferred embodiment of FIG. 15(b) the grating relief direction alternates between columns—in the odd-numbered columns in FIG. 15(b) the grating relief direction runs from top left to bottom right (ie, at +135°, or −45°, to the vertical direction in FIG. 15(b)), whereas in the even-numbered columns it runs from bottom left to top right (ie, at +45° to the vertical direction). The alignment of the grating relief direction is identical (within manufacturing tolerances) for all pixels in all odd-numbered columns, and is also identical (again within manufacturing tolerances) for all pixels in all even-numbered columns. The grating relief direction is, however, different between odd-numbered columns and even-numbered columns so that the polarisation of light emitted by pixels in odd-numbered columns is different from the direction of polarisation of light emitted by pixels in even-numbered columns.

In a particularly preferred embodiment the grating relief direction in pixels in odd-numbered columns is substantially at 90° to the grating relief direction in pixels in even-numbered columns. In this embodiment, therefore, the polarisation of light emitted by pixels in odd-numbered columns is substantially orthogonal to the direction of polarisation of light emitted by pixels in even-numbered columns.

It should be noted that the references herein to rows and columns do not imply that the invention is limited to horizontal rows and vertical columns. Instead, these terms refer to the standard well-known way in which image data are entered row by row. Although pixel rows are normally arranged horizontally and pixel columns vertically in displays, this is not essential and the rows could, for example, equally well be arranged vertically with the columns then being arranged horizontally.

The light-emitting device 25' of FIGS. 15(a) and 15(b) may be used as a light-emitting element in an image display system such as, for example, a conventional 2-D display, a passive stereoscopic display, or an active stereoscopic display. The light-emitting device acts as an image display element and displays one or more images for display by an observer.

When a stereoscopic display device-that incorporates the light-emitting device 25' of FIGS. 15(a) and 15(b) is used in a 2-D display mode, an image is displayed in a conventional manner using pixels in both odd-numbered and even-numbered columns. As explained in connection with the embodiment of FIGS. 14(a) and 14(b), the stereoscopic display device would not require the external polariser of a conventional stereoscopic display, since the light-emitting device 25' emits polarised light, so that the intensity loss caused by a conventional external polariser is eliminated. Furthermore, the brightness of colour artefacts associated with the prior art microcavity display device would not be present.

To use the light-emitting device 25' of FIGS. 15(a) and 15(b) in a passive stereoscopic display system, the observer's glasses would have, in one eye, a polariser whose transmission direction is parallel to the polarisation direction of light emitted by either the odd-numbered or the even-numbered columns of the light-emitting device. The polariser in the other eye of the observer's glasses would be arranged with its transmission axis orthogonal to the transmission axis of the polariser for the first eye. A stereoscopic image would be obtained by displaying a first image using odd-numbered columns and displaying a second image using even-numbered columns.

For example, the left eye image could be displayed on the pixels of the odd-numbered columns. In this case, the observer glasses would have the polariser for the left eye arranged with its transmission axis parallel to the polarisation direction of light emitted by pixels of the odd-numbered columns. The left eye image displayed by the pixels of the odd-numbered columns would therefore be transmitted into the observer's left eye. Provided that the grating relief direction in pixels in odd-numbered columns is substantially at 90° to the grating relief direction in pixels in even-numbered columns, the transmission axis of the right-eye polariser would, however, be orthogonal to the transmission axis of the left eye polariser, so that the left eye image would be blocked by the right eye polariser. Conversely, the even-numbered pixels would display the right eye image, and this would be transmitted by the right eye polariser but blocked by the left eye polariser. Thus, the observer's left eye would see only the left eye image and the observer's right eye would see only the right eye image, and a stereoscopic image would thereby be obtained.

The light-emitting device of FIGS. 15(a) and 15(b) can therefore provide a stereoscopic display system that requires no external optical systems of any sort to be connected to the display element. The only optical element required is the observer's passive polarising glasses.

Furthermore, in a stereoscopic display system incorporating the light-emitting device 25' of FIGS. 15(a) and 15(b), the left eye image and the right eye image are both displayed continuously and simultaneously. This is in contrast to conventional passive stereoscopic display systems, in which the images for each eye are displayed in a time-sequential manner. The present invention thus provides an improved image quality compared to previous passive stereoscopic display systems, since "flicker" caused by the time-sequential display of the left-eye image and the right-eye image is eliminated.

The elimination of the need to provide additional optical elements, such as patterned polarisers which are required in some prior art passive stereoscopic display systems, reduces the cost and complexity of the stereoscopic display system of the invention. Furthermore, where additional optical elements are provided in some prior art stereoscopic display systems it is necessary to ensure that they are in correct registration with pixels of the display element in order to prevent parallax or cross-talk between the left eye image and the right eye image. Since no additional optical elements are required in a stereoscopic display system that incorporates an OLED of FIG. 14(b) or 15(b) of the invention, the requirement for correct registration of additional optical elements is completely eliminated. The possibility of parallax or image cross talk occurring if registration is not correct is also eliminated.

Figure 16B:
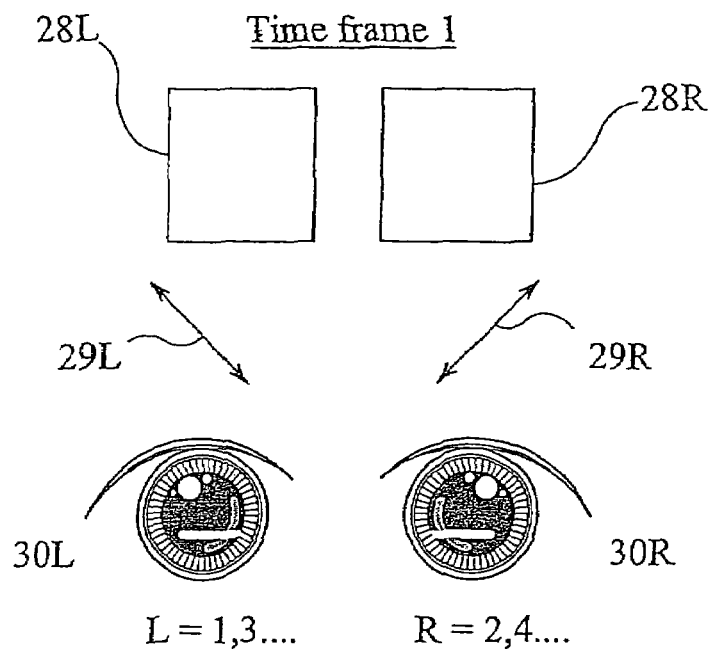
FIGS. 16(b) and 16(c) illustrate the operation of the stereoscopic display device of FIG. 16(a)
Figure 16C:
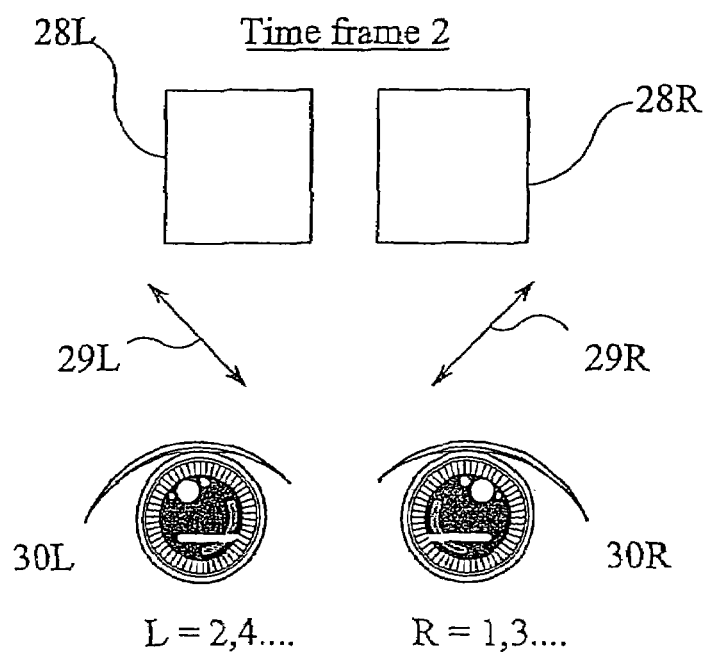

The light-emitting device 25' of FIG. 15(b) may also be used in an active stereoscopic display system, and this is illustrated in FIGS. 16(a) to 16(c).

The light-emitting display devices of the invention have been described above with reference to OLEDs. The invention is not limited to these devices, however, but may be used to align an emissive layer in other light-emitting devices.

FIG. 16(a) shows an active stereoscopic display system 39 being viewed by an observer represented in the figure by their left eye 30L and right eye 30R. The display system comprises an light-emitting device 25' of the type described with reference to FIGS. 15(a) and 15(b) above. An image displayed on the light-emitting device 25' is viewed by the observer through active glasses 38. The active observer's glasses 38 in the stereoscopic display system 39 of FIG. 16(a) comprise, for each eye, a switchable $\lambda/2$ retarder 28L, 28R, and a linear polariser 29L, 29R having a fixed transmission axis. The transmission axis 29L' of the left eye polariser 29L is substantially orthogonal to the transmission axis 29R' of the right eye polariser 29R. Furthermore, the transmission axis of the left eye polariser 29L is substantially parallel to the grating relief direction of odd-numbered columns of the light-emitting device 25' whereas the transmission axis of the right eye polariser 29R is substantially parallel to the grating relief direction of even-numbered columns of the light-emitting device 25'. The left-eye and right-eye switchable retarders 28L, 28R may be embodied as a single switchable retarder.

FIGS. 16(*b*) and 16(*c*) illustrate the operation of the display system 39 in two time frames. The light-emitting device 25' is omitted from FIGS. 16(*b*) and 16(*c*) for clarity.

In the first time frame, shown in FIG. 16(*b*), the switchable $\lambda/2$ retarders 28L, 28R are switched so that light passing through the $\lambda/2$ retarders does not experience any phase shift. In the active stereoscopic display system of FIG. 16(*a*), as explained above, the transmission axis of the left eye polariser 29L is arranged to be substantially parallel to the polarisation direction of light emitted by pixels in the odd-numbered columns, and the transmission axis of the right eye polariser 29R is arranged to be substantially parallel to the polarisation direction of light emitted by pixels in the even-numbered columns. The polarisation direction of light emitted by pixels in the odd-numbered columns is substantially orthogonal to the polarisation direction of light emitted by pixels in the even-numbered columns. Accordingly, in the first time frame, when the $\lambda/2$ retarders 28L, 28R induce no phase shift in light transmitted through the retarders, the left eye polariser 29L transmits light from pixels in odd-numbered columns and blocks light from pixels in even-numbered columns. Conversely, the right eye polariser 29R transmits light from pixels in even-numbered columns but blocks light from pixels in odd-numbered columns. Thus, the observer's left eye 30L sees only light from pixels in odd-numbered columns whereas the observer's right eye 30R sees only light from pixels in even-numbered columns. A stereoscopic image may be obtained by displaying a left eye image on pixels of odd-numbered columns while displaying a right eye image on pixels on even-numbered columns. The two images are displayed simultaneously with one another, but are interlaced with each image-being displayed in alternate columns.

In time frame two, as shown in FIG. 16(*c*) the $\lambda/2$ retarders 28L, 28R are arranged to induce a $\lambda/2$ phase shift in light passing through the retarders so that each retarder will rotate the plane of polarisation of light passing through the retarder by 90°. As a result of this, light emitted from pixels in odd-numbered columns is now blocked by the left eye polariser, since its plane of polarisation is rotated by 90° by the left eye $\lambda/2$ retarder and so is orthogonal to the transmission axis of the left eye polariser when it reaches the left eye polariser. Light from even-numbered columns is, however, now transmitted by the left eye polariser. Conversely, the right eye polariser 29R now transmits light emitted by pixels in odd-numbered columns, and blocks light from pixels in even-numbered columns.

In order to display a 3-D image, when the switchable retarders 28L, 28R are switched at the start of time frame two, the pixels in odd-numbered columns are switched to display the right-eye image rather than the left-eye image whereas the pixels in even-numbered columns are switched to display the left-eye image rather than the right-eye image. Thus, at the start of time frame two the left eye image displayed on the OLED 25' is moved from odd-numbered columns to even-numbered columns and the right eye image is moved from even-numbered columns to odd-numbered columns. Thus, the left eye 30L of the observer continues to see the left eye image, and the right eye 30R of the observer continues to see the right eye image. However, because the left eye image and the right eye image are displayed on all columns over the course of the two time frames, the left eye image and the right eye image may now be displayed with the full resolution of the display 25'. The active stereoscopic display of the invention, which is both spatially and temporally multiplexed, allows full screen resolution to be perceived by both eyes, whereas a conventional interlaced display system allows each image to be displayed with only half the full resolution of the display element.

The active stereoscopic display of FIG. 16(*a*) may again be used to display a conventional 2-D image. It is necessary simply for the observer to remove the glasses, and for a conventional 2-D image to be displayed on the light-emitting device.

FIG. 17 illustrates a further stereoscopic display system 40 of the present invention. This again comprises a pixelated light-emitting device 25' of the type described with reference to FIGS. 15(*a*) and 15(*b*) above. For simplicity, the full pixel structure of the light-emitting device 25' is not shown in FIG. 17, and only the columns of pixels are shown.

A $\lambda/4$ waveplate 31 is disposed between the light-emitting device 25' and an observer (not shown). The $\lambda/4$ waveplate 31 acts to convert the polarisation of light emitted by the light-emitting device from linear polarisation into circular polarisation. Light from odd-numbered columns is converted into light that is circularly polarised in one direction, and light from even-numbered columns is converted into light that is circularly polarised in the opposite direction. The output polarisations produced by the $\lambda/4$ plate 31 are indicated schematically at 32. The stereoscopic display system of FIG. 17 further comprises observer glasses (not shown) that are similar to the observer glasses 38 of FIG. 16(*a*) but that contain circular polarisers rather than the linear polarisers 29L, 29R of FIG. 16(*a*).

The embodiment of FIG. 17 may be applied either to a passive stereoscopic display system or to an active stereoscopic display system, as described with reference to FIGS. 15 and 16 above. Furthermore, the display system of FIG. 17 may be used as a conventional 2-D display system by displaying a single image on the light-emitting device 25' and the observer removing their viewing glasses.

In the stereoscopic display devices described above, the light-emitting device has been used as an image display element. While many stereoscopic display devices comprise an image display element of this sort, other stereoscopic display devices are known in which the image display element does not itself emit light but is illuminated by a back light disposed behind the image display element.

Stereoscopic display devices in which a non-emissive display element is illuminated by a back light are described in, for example, EP-A-0 833 183, EP-A-0 764 869 and U.S. Pat. No. 5,917,562. All conventional stereoscopic displays of this type have a back light that emits unpolarised light and means for polarising the unpolarised light emitted by the back light. The conventional devices therefore suffer from a number of problems, since the system becomes bulky and more expensive because of the need to provide the polariser between the back light and the image display element. Furthermore, in display systems that use a patterned polariser, it is necessary to ensure that the polariser is correctly registered with other elements of the system.

The light-emitting devices of the invention described above emit light that is linearly polarised. They may therefore be used as a back light for a stereoscopic display system, in place of the combination of the unpolarised back light and polariser of conventional back-lit stereoscopic display systems. Since no separate polariser is required, the size and cost of the display system are reduced.

Figure 18:
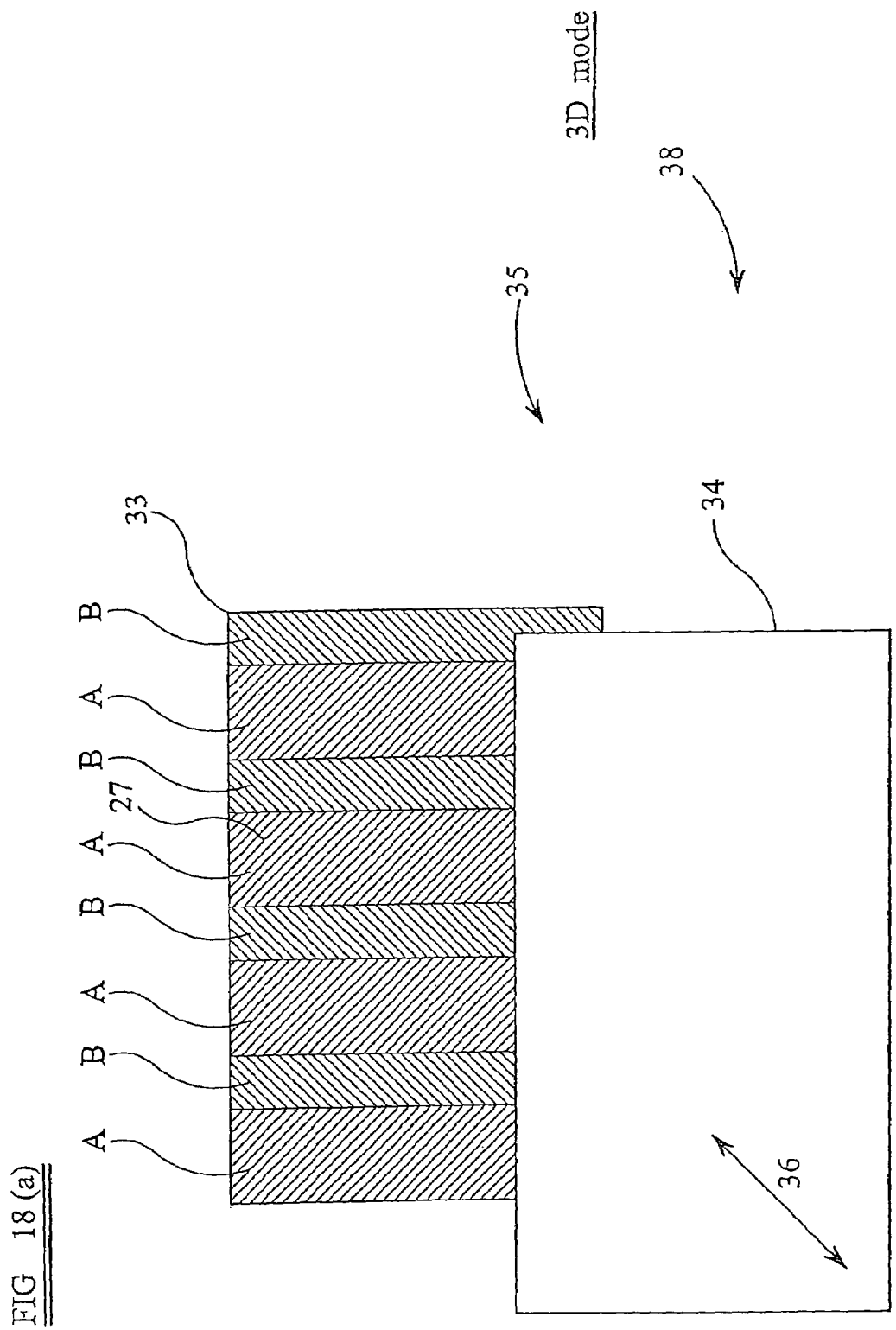
FIGS. 18(a) and 18(b) shows the 3-D and 2-D modes of operation of another stereoscopic display device incorporating a light-emitting device of the present invention.
Figure 18B:
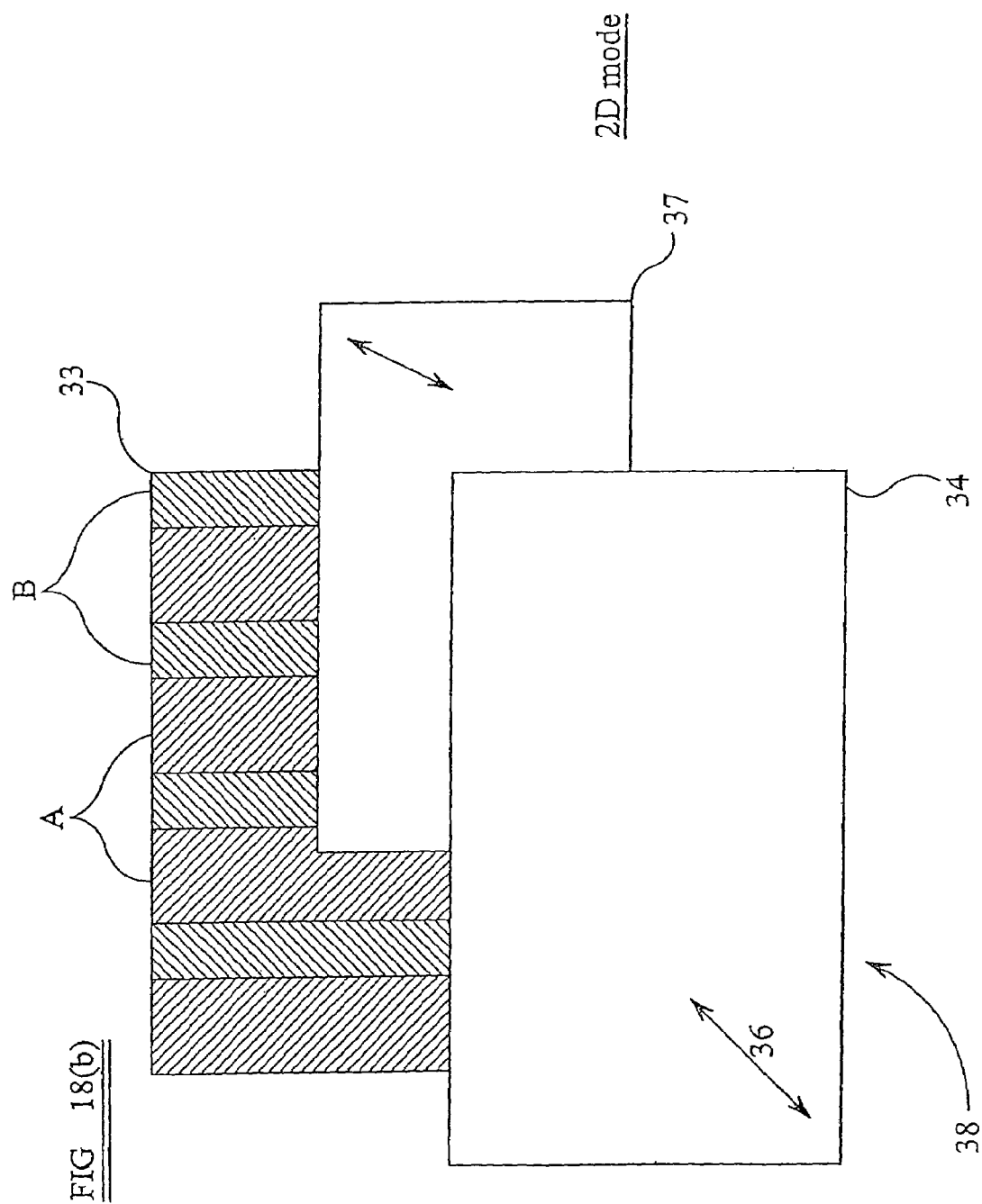

FIGS. 18(a) and 18(b) illustrate a display device 35 that incorporates an light-emitting device of the present invention. In contrast to the embodiments of FIGS. 15-17, the light-emitting device is acting as a back light in the embodiments of FIGS. 18(a) and 18(b).

The display device 35 of FIG. 18(a) comprises an image display element denoted generally as 38. This may be, for example, a conventional liquid crystal display device such as an active matrix (thin film transistor) liquid crystal display device. FIGS. 18(a) and 18(b) illustrate an embodiment in which the image display element 38 is a liquid crystal display device having a liquid crystal layer sandwiched between two linear polarisers. The construction of the image display element 38 is, in this embodiment, entirely conventional and only the input polariser 35 of the image display element 38 is shown in FIGS. 18(a) and 18(b). The image display element 38 does not itself emit light, but is illuminated by light from a back light 33. The back light 33 is formed by an light-emitting device of the present invention.

The light-emitting device 33 of the display device 35 of FIG. 18(a) is shown with the components separated, for ease of explanation. The lines 27 again indicate the direction of the grating relief structure of the light-emitting device, and thus indicate the alignment direction of the emissive layer of the light-emitting device. It will be seen that the back light 33 comprises alternating stripes A, B, with the alignment direction of the emissive layer in a stripe A being substantially orthogonal to the alignment direction of emissive molecules in an adjacent stripe B. In FIG. 18(a) the stripes A are wide whereas the stripes B are narrow.

The transmission axis of the input polariser 34 of the image display element is indicated at 36. It will be seen that this transmission axis 36 is substantially parallel to the direction of light emitted by the narrow stripes B of the light-emitting device 33, but is substantially orthogonal to the direction of polarisation of light emitted by the wide columns A of the back light 33. As a result, the image display element 38 transmits only light from the narrow stripes B of the back light 33, and blocks light from the wide stripes A of the back light. This provides a parallax barrier, so that the display device 35 can function as an auto-stereoscopic display device—that is, the user is not required to wear polarising or colour filter glasses in order to perceive a 3-D image.

The display device 35 may also be used as a conventional 2-D device, and this is illustrated in FIG. 18(b). In the 2-D mode, a half-wave plate 37 is inserted in the optical path between the back light 33 and the input polariser 34 of the image display element 38. The half wave plate is arranged so that it rotates the plane of polarisation of light emitted by both the wide and narrow columns A, B of the back light 33, so that the image display element will pass light emitted by the wide columns A and light emitted by the narrow columns B of the back light. The full area of the backlight illuminates the image display element, and the device 35 therefore acts as a conventional, 2-D display.

In this embodiment, the back light has two spatially interlaced regions of different polarisation—the stripes A together constitute one region and the stripes B together constitute the other region. There are two options for driving each region to emit light:

(a) the back light may have a single uniform electrode that drives both regions simultaneously—so both regions would be either simultaneously ON (i.e., emitting light) or simultaneously OFF (i.e., not emitting light); or (b) the back light may have a have patterned electrode structure so that the two regions can be driven independently from one another (so that, for example, the region formed by the wide stripes A can be OFF while the region formed by the narrow stripes B is ON).

In the display device of FIGS. 18(a) and 18(b), the back light is preferably provided with a single uniform electrode since, as explained above, the 3-D display mode can be obtained when the region of the back light constituted by the wide stripes A and the region of the backlight constituted by the narrow stripes B are simultaneously ON. The need to provide the back light with patterned electrodes and the associated driving circuitry is therefore avoided, and the manufacturing costs are reduced.

In principle, the back light of FIG. 18(a) could be provided with patterned electrodes, and it would then be possible to switch between a 2-D display mode and a 3-D display mode simply by driving the back light appropriately. In a 3-D display mode the narrow stripes B would be ON whereas the wide stripes A would be OFF, so that a parallax barrier is generated. In a 2-D display mode the wide stripes A and narrow stripes B would be ON simultaneously, and a 2-D display mode would be obtained without the need to provide a half-wave plate between the back light and the imager display element.

The embodiment of FIGS. 18(a) and 18(b) may be realised using a retarder 37 that is movable, for example mechanical movable, between a first position in which the retarder is disposed in an optical path between the device and the image display element (as shown in FIG. 18(b)) and a second position in which the retarder is not in the optical path between the device and the image display element. This allows the device 35 to be easily switched between the 2-D display mode and the 3-D display mode.

The half wave plate 37 shown in FIG. 18(b) does not however need to be mechanically removable. The half wave plate 37 could comprise a switchable half wave plate that is disposed in the optical path between the device and the image display element and that can be switched between zero retardation and $\lambda/2$ retardation. Where the half wave plate 37 is a switchable half wave plate, it may conveniently be embodied as a switchable liquid crystal half-wave plate. In this embodiment the retarder would be present in the 3-D display mode of FIG. 18(a), but would be switched to provide substantially zero retardation.

When the device 35 is acting in the 2-D mode, it is preferable that the image display element 38 passes light from the narrow columns B and the wide columns A with substantially equal intensities. This may be achieved if, when half wave plate 37 is present (in the case of a mechanically removable plate) or the retarder is switched to give $\lambda/2$ retardation (in the case of a switchable retarder), the optic axis of the retarder is arranged such that light from the first regions A and second regions B of the emissive layer exit the retarder polarised at substantially 90° to one another. The transmission axis of the input polariser of the image display element can then be arranged at 45° to the plane of polarisation of light from both the first regions A and second regions B.

FIG. 18(b) illustrates one way in which this can be achieved. In this preferred embodiment, the back light 33 emits light that is linearly polarised at ±45° to a reference direction (in FIG. 18(b) the reference direction is the vertical axis, but the reference direction could be any direction in the plane of the polarisation of light)—the wide stripes A emit light polarised at −45° to the reference direction and the narrow stripes emit light polarised at +45° to the reference direction.

The half wave plate 37 has its optic axis arranged at +22.5° to the reference direction. The light emitted by the narrow stripes B is therefore rotated so that its plane of polarisation is at 0° to the reference direction, whereas light from the wide stripes A is rotated so that its plane of polarisation is at +90° to the reference direction.

The transmission axis 36 of the input polariser 34 of the image display element 38 is arranged at +45° to the reference direction. After passing through the half wave plate therefore, light from the narrow stripes B has its plane of polarisation at 45° to the transmission axis 36 of the input polariser 34, and light from the wide stripes A of the back light 33 also has its direction of polarisation at 45° to the transmission axis 36 of the input polariser 34. The input polariser 34 will therefore pass light from the narrow columns B and the wide columns A with substantially equal intensities.

Co-pending UK patent application No. 0215058.9 discloses a display system that is switchable between a 2-D mode and a 3-D mode. This discloses a display system in which the image display element is illuminated by a back light that emits unpolarised light. Light from the back light passes through a polariser and a patterned phase-retarder element before being incident on the image display element. Compared to this prior device, the back light 33 of the display system of FIGS. 18(a) and 18(b) combines the roles of the back light, the polariser and the patterned phase-retarder element. The invention therefore provides a substantial reduction in the size of the display system, and also in the cost of the display system. Furthermore, the intensity of the display is improved by the omission of the polariser and patterned phase-retarder element.

The patterned back light of the invention may also be used as a back light in an auto-stereoscopic device of the type described in U.S. Pat. No. 5,917,562. This prior art auto-stereoscopic display uses directional illumination of nominally two ray bundles. Each ray bundle is imaged to a different location in space, and the two ray bundles have mutually orthogonal polarisations. In one embodiment, the polarised light to form the bundles is generated by an unpolarised extended back light, a uniform polariser, and a switchable, liquid crystal cell. Alternatively, the polarised light is generated by an unpolarised back light having a patterned polariser. These prior art combinations of unpolarised back light and patterned polariser, or unpolarised back light, uniform polariser and patterned liquid crystal cell, may be replaced by the patterned back light of the present invention. This again reduces the volume, complexity and cost of the display system.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-emitting device comprising a substrate, a light-emissive layer disposed over the substrate, and a grating for aligning the light-emissive layer, wherein the grating comprises a plurality of substantially parallel ridges or grooves to align molecules of the light-emissive layer so as to be substantially parallel to the substantially parallel ridges or grooves to produce light that is at least partially plane-polarised.

2. A device as claimed in claim 1 wherein the light-emissive layer contains a material having a liquid crystalline phase.

3. A device as claimed in claim 1 wherein the grating is defined in the substrate.

4. A device as claimed in claim 1 wherein the grating is defined by material deposited on a surface of the substrate.

5. A device as claimed in claim 4 wherein the material deposited on the surface of the substrate comprises two or more stripes extending substantially parallel to one another.

6. A device as claimed in claim 4 wherein the material deposited on the surface of the substrate comprises a photoresist.

7. A device as claimed in claim 1 and comprising an electrode for addressing the light-emissive layer, wherein the grating is defined in the electrode.

8. A device as claimed in claim 1 and further comprising an organic layer, wherein the grating is defined in the organic layer.

9. A device as claimed in claim 8 wherein the organic layer is a transport layer.

10. A device as claimed in claim 9 wherein the grating has a cross-section that is substantially sinusoidal.

11. A device as claimed in claim 1 wherein the grating has no faces that are substantially perpendicular to the plane of the substrate.

12. A device as claimed in claim 1 wherein the pitch of the grating is at least 100 nm.

13. A device as claimed in claim 1 wherein the pitch of the grating is less than 20 µm.

14. A device as claimed in claim 1 wherein the height of the grating is at least 20 nm.

15. A device as claimed in claim 1 wherein the height of the grating is less than 1 µm.

16. A device as claimed in claim 1 wherein the grating aligns substantially the entire area of the light-emissive layer in a first direction.

17. An image system comprising a light-emmitting device as claimed in claim 16.

18. An image display system as claimed in claim 17 wherein the light-emitting device forms, in use, an image display element.

19. A device as claimed in claim 1 wherein the grating aligns a first region of the light-emissive layer in a first direction and aligns a second region of the light-emissive layer in a second direction different from the first direction.

20. A device as claimed in claim 19 wherein the first direction is at substantially 90° to the second direction.

21. An image display system comprising a light-emitting device as claimed in claim 19.

22. An image display system as claimed in claim 21 wherein the light-emitting device forms, in use, an image display element.

23. An image display system as claimed in claim 21 and further comprising an image display element, wherein the light-emitting device forms, in use, a backlight for illuminating the image display element.

24. An image display system as claimed in claim 23 and further comprising a switchable retarder disposed in an optical path between the light-emitting device and the image display element.

25. An image display system as claimed in claim 24 wherein the retardation of the switchable retarder is switchable between 0 and $\lambda/2$.

26. An image display system as claimed in claim 25 wherein, for one retardation state of the switchable retarder, the optic axis of the switchable retarder is arranged such that light from the first and second regions of the emissive layer exit the switchable retarder polarised at substantially 90° to one another.

27. An image display system as claimed in claim 26 wherein the first direction is at substantially +45° to a reference direction, the second direction is at substantially −45° to the reference direction, and the optic axis of the retarder is at substantially +22.50° to the reference direction.

28. An image display system as claimed in claim 23 and further comprising a retarder movable between a first position in which the retarder is disposed in an optical path between the device and the image display element and a second position.

29. An image display system as claimed in claim 28 wherein the retardation of the retarder is substantially λ/2.

30. An image display system as claimed in claim 28 wherein, when the retarder is in the first position, the optic axis of the retarder is arranged such that light from the first and second regions of the emissive layer exit the retarder polarised at substantially 9020 to one another.

31. An image display system as claimed in claim 30 wherein the first direction is at substantially +45° to a reference direction, the second direction is at substantially −45° to the reference direction, and the optic axis of the retarder is at substantially +22.5° to the reference direction.

32. A device as claimed in claim 1 and comprising a plurality of individually addressable pixels.

* * * * *